US009437654B2

(12) United States Patent
Lee et al.

(10) Patent No.: US 9,437,654 B2
(45) Date of Patent: Sep. 6, 2016

(54) MAGNETIC MEMORY DEVICES

(71) Applicants: Sung-Chul Lee, Osan-si (KR);
Kwang-Seok Kim, Seoul (KR);
Kee-Won Kim, Suwon-si (KR);
Young-Man Jang, Hwaseong-si (KR);
Ung-Hwan Pi, Hwaseong-si (KR)

(72) Inventors: Sung-Chul Lee, Osan-si (KR);
Kwang-Seok Kim, Seoul (KR);
Kee-Won Kim, Suwon-si (KR);
Young-Man Jang, Hwaseong-si (KR);
Ung-Hwan Pi, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/715,633

(22) Filed: May 19, 2015

(65) Prior Publication Data

US 2016/0093669 A1    Mar. 31, 2016

(30) Foreign Application Priority Data

Sep. 29, 2014 (KR) .................. 10-2014-0129937

(51) Int. Cl.
*H01L 27/22*    (2006.01)
*H01L 43/10*    (2006.01)

(52) U.S. Cl.
CPC .......... *H01L 27/222* (2013.01); *H01L 43/10* (2013.01)

(58) Field of Classification Search
CPC .............................. H01L 27/22; H01L 43/10
USPC .............................. 257/421, 422, 252; 438/3
See application file for complete search history.

(56) References Cited

U.S. PATENT DOCUMENTS

| 6,862,210 | B2* | 3/2005 | Tsuchida et al. | ............. 365/158 |
|---|---|---|---|---|
| 7,180,713 | B2 | 2/2007 | Nagasaka et al. | |
| 7,379,280 | B2 | 5/2008 | Fukumoto et al. | |
| 8,178,363 | B2 | 5/2012 | Wang et al. | |
| 8,456,897 | B2 | 6/2013 | Ranjan et al. | |
| 8,477,530 | B2 | 7/2013 | Ranjan et al. | |
| 8,493,777 | B2 | 7/2013 | Ranjan et al. | |
| 8,542,466 | B2 | 9/2013 | Fuji et al. | |
| 8,592,061 | B2 | 11/2013 | Onoue et al. | |
| 8,671,554 | B2 | 3/2014 | Fukuzawa et al. | |
| 8,685,491 | B2 | 4/2014 | Takeo et al. | |
| 8,716,819 | B2 | 5/2014 | Kitagawa et al. | |
| 2004/0108561 | A1* | 6/2004 | Jeong | ............. 257/422 |
| 2008/0084635 | A1 | 4/2008 | Lee et al. | |
| 2010/0297475 | A1 | 11/2010 | Kawakami et al. | |
| 2012/0212998 | A1* | 8/2012 | Ranjan et al. | ............. 365/158 |
| 2013/0037862 | A1* | 2/2013 | Kitagawa et al. | ............. 257/252 |

FOREIGN PATENT DOCUMENTS

KR        100803217 B1     2/2008

* cited by examiner

*Primary Examiner* — Sheng Zhu
(74) *Attorney, Agent, or Firm* — Myers Bigel & Sibley, P.A.

(57) ABSTRACT

Magnetic memory devices may include a substrate, a circuit device on the substrate, a plurality of lower electrodes electrically connected to the circuit device, a magnetic tunnel junction (MTJ) structure commonly provided on the plurality of the lower electrodes, and a plurality of upper electrodes on the MTJ structure. The MTJ structure may include a plurality of magnetic material patterns and a plurality of insulation material patterns separating the magnetic material patterns from each other.

18 Claims, 21 Drawing Sheets

SECOND
DIRECTION
⊗ ⟶ FIRST
DIRECTION

MAGNETIC MEMORY DEVICES

CROSS-REFERENCE TO RELATED APPLICATION

This application claims priority under 35 USC §119 to Korean Patent Application No. 10-2014-0129937, filed on Sep. 29, 2014, in the Korean Intellectual Property Office (KIPO), the disclosure of which is incorporated by reference herein in its entirety.

FIELD

Example embodiments relate to magnetic memory devices. More particularly, example embodiments relate to magnetic memory devices including a magnetic layer.

BACKGROUND

A magnetic random access memory (MRAM) device is a non-volatile memory device in which data is stored using a resistance change of a magnetic tunnel junction (MTJ) structure. The MRAM device has been widely researched due to a rapid operation and a structural stability thereof.

However, as the MRAM device becomes highly integrated, a distance between neighboring memory cells or between neighboring MTJ structures may be decreased. Accordingly, a reliability of the MTJ structure may degrade.

SUMMARY

Example embodiments provide a magnetic memory device having improved electrical and mechanical reliability.

According to example embodiments, there is provided a magnetic memory device. The magnetic memory device includes a substrate, a circuit device on the substrate, a plurality of lower electrodes electrically connected to the circuit device, a magnetic tunnel junction (MTJ) structure commonly provided on the plurality of the lower electrodes, and a plurality of upper electrodes on the MTJ structure. The MTJ structure includes a plurality of magnetic material patterns, and a plurality of insulation material patterns segmenting or separating the magnetic material patterns.

In example embodiments, the MTJ structure may have a plate shape extending in a first direction and a second direction parallel to a top surface of the substrate and perpendicular to each other.

In example embodiments, the magnetic material patterns may include at least one selected from iron (Fe), cobalt (Co), nickel (Ni), chrome (Cr) and platinum (Pt). The insulation material patterns may include at least one selected from silicon oxide, silicon nitride and silicon oxynitride.

In example embodiments, a grain boundary separating the magnetic material patterns may be formed by the insulation material patterns.

In example embodiments, the insulation material patterns may include a ring pattern or a net pattern.

In example embodiments, the magnetic material patterns may be formed in holes included in the ring pattern or the net pattern.

In example embodiments, the MTJ structure may include a first magnetic layer, a tunnel barrier layer and a second magnetic layer sequentially stacked from top surfaces of the lower electrodes.

In example embodiments, the magnetic material patterns and the insulation material patterns may be included in at least one of the first magnetic layer and the second magnetic layer.

In example embodiments, the material patterns and the insulation material patterns may be distributed throughout an entire area of the first magnetic layer or the second magnetic layer.

In example embodiments, each of the lower electrodes and each of the upper electrodes may overlap each other to form a pair of a lower electrode and an upper electrode. A portion of the magnetic material patterns between the pair of the lower electrode and the upper electrode may serve as a cell pattern. A remaining portion of the magnetic material patterns except for the cell pattern may serve as a dummy magnetic pattern.

In example embodiments, the magnetic memory device may further include an isolation layer on the substrate. The substrate may include a plurality of active patterns defined by the isolation layer.

In example embodiments, the circuit device may include a gate structure extending through the active patterns and the isolation layer, and impurity regions at upper portions of the active patterns adjacent to the gate structure.

In example embodiments, the magnetic memory device may further include lower electrode contacts electrically connected to the impurity regions. The lower electrodes may be disposed on the lower electrode contacts.

According to example embodiments, there is provided a magnetic memory device. The magnetic memory device includes a plurality of first conductive lines extending in a first direction, a plurality of second conductive lines extending over the first conductive lines and in a second direction crossing the first direction, a magnetic tunnel junction (MTJ) structure commonly provided at intersection areas of the first conductive lines and the second conductive lines, and including a plurality of magnetic material patterns and a plurality of insulation material patterns segmenting or separating the magnetic material patterns, a plurality of lower electrodes at the intersection areas and between the first conductive lines and the MTJ structure, and a plurality of upper electrodes at the intersection areas and between the second conductive lines and the MTJ structure.

In example embodiments, the MTJ structure includes a first magnetic layer, a tunnel barrier layer and a second magnetic layer sequentially stacked from top surfaces of the lower electrodes. The magnetic material patterns and the insulation material patterns may be included in at least one of the first magnetic layer and the second magnetic layer.

In example embodiments, the MTJ structure has a fence shape extending in the first direction or the second direction, and a plurality of the MTJ structures may be arranged along the second direction or the first direction.

In example embodiments, the first conductive lines may serve as word lines, and the second conductive lines may serve as bit lines.

In example embodiments, the magnetic memory device may further include selection devices between the first conductive lines and the lower electrodes.

According to example embodiments, there is provided a magnetic memory device. The magnetic memory device includes a substrate, a circuit device on the substrate, a plurality of lower electrodes electrically connected to the circuit device, a magnetic tunnel junction (MTJ) structure provided commonly on the plurality of the lower electrodes and including a first magnetic layer, a tunnel barrier layer and a second magnetic layer sequentially stacked on the lower electrodes, magnetic material patterns distributed in at least one of the first magnetic layer and the second magnetic layer, insulation material patterns segmenting or separating the magnetic material patterns, and a plurality of upper electrodes on the MTJ structure.

In example embodiments, the magnetic material patterns and the insulation material patterns may be formed simultaneously or concurrently by depositing a ferromagnetic metal in an atmosphere including oxygen and/or nitrogen.

BRIEF DESCRIPTION OF THE DRAWINGS

Example embodiments will be more clearly understood from the following detailed description taken in conjunction with the accompanying drawings.

FIG. 1 is a cross-sectional view illustrating a magnetic memory device in accordance with example embodiments;

FIGS. 2 and 3 cross-sectional views illustrating magnetic memory devices in accordance with some example embodiments;

FIGS. 4 to 11 are cross-sectional views and plan views illustrating a method of manufacturing a magnetic memory device in accordance with example embodiments;

FIGS. 12 and 13 are a plan view and a cross-sectional view, respectively, illustrating a magnetic memory device in accordance with example embodiments;

FIGS. 14 to 22 are plan views and cross-sectional views illustrating a method of manufacturing a magnetic memory device in accordance with example embodiments;

FIG. 23 is a perspective view illustrating a magnetic memory device in accordance with example embodiments;

FIGS. 24 and 25 are perspective views illustrating magnetic memory devices in accordance with some example embodiments; and FIG. 26 is a block diagram of an information processing system in accordance with example embodiments.

DESCRIPTION OF EMBODIMENTS

Figure 1:
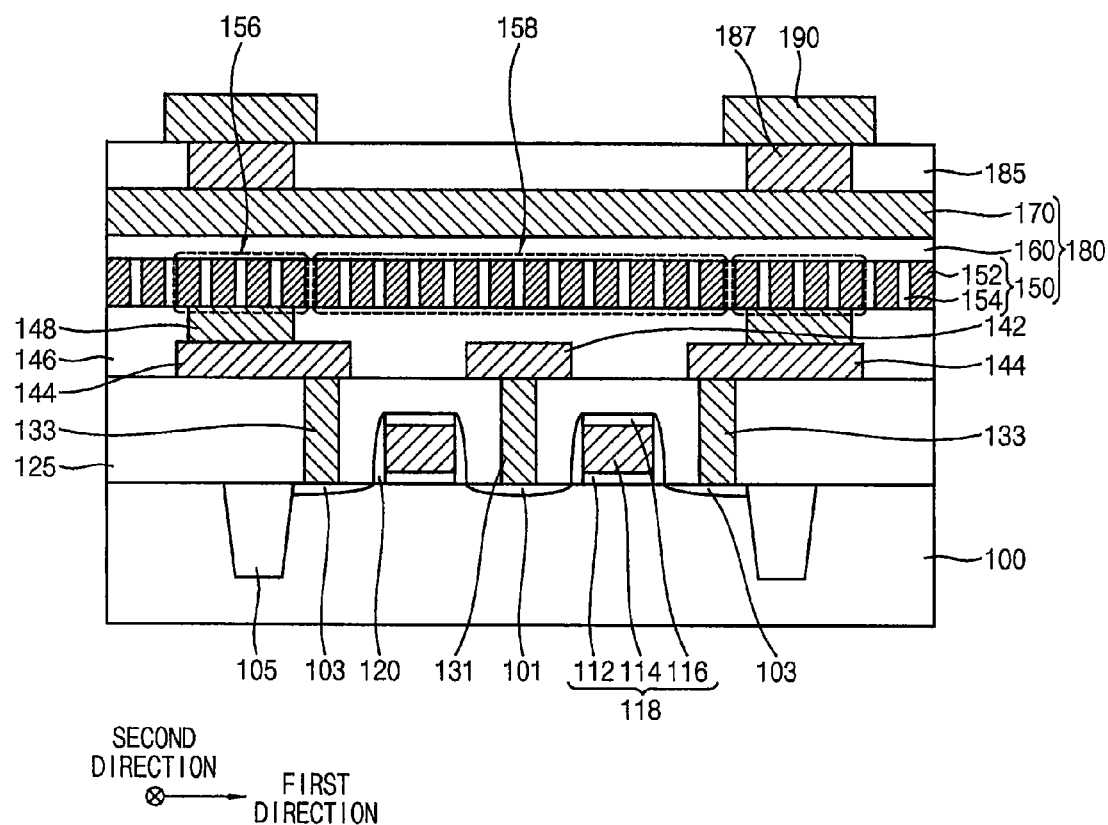
FIGS. 1 to 26 represent non-limiting, example embodiments as described herein.

Various example embodiments will be described more fully hereinafter with reference to the accompanying drawings, in which some example embodiments are shown. The present inventive concept may, however, be embodied in many different forms and should not be construed as limited to the example embodiments set forth herein. Rather, these example embodiments are provided so that this description will be thorough and complete, and will fully convey the scope of the present inventive concept to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a cross-sectional view illustrating a magnetic memory device in accordance with example embodiments.

Referring to FIG. 1, the magnetic memory device may include a circuit device formed on a substrate 100, a lower electrode 148 electrically connected to the circuit device, an upper electrode 187 facing the lower electrode 148, a magnetic tunnel junction (MTJ) structure 180 interposed between the lower electrode 148 and the upper electrode 187, and a bit line 190 disposed on the upper electrode 187.

The substrate 100 may include silicon, germanium, silicon-germanium or a group III-V compound such as GaP, GaAs, GaSb, etc. In some embodiments, the substrate 100 may be a silicon-on-insulator (SOI) substrate or a germanium-on-insulator (GOI) substrate.

An isolation layer 105 may be formed at an upper portion of the substrate 100 such that the substrate 100 may be divided into an active region and a field region. The isolation layer 105 may include an insulative material such as silicon oxide.

A gate structure 118 may be disposed on the active region of the substrate 100. The gate structure 118 may include a gate insulation layer pattern 112, a gate electrode 114 and a gate mask pattern 116 sequentially stacked on a top surface of the substrate 100. A gate spacer 120 may be further formed on a sidewall of the gate structure 118.

The gate insulation layer pattern 112 may include silicon oxide or a metal oxide. The gate electrode 114 may include a metal such as tantalum, aluminum or tungsten, a metal nitride and/or a metal silicide. The gate mask pattern 116 and the gate spacer 120 may include, e.g., silicon nitride.

In example embodiments, the gate electrode 114 may serve as a word line of the magnetic memory device.

An impurity region may be formed at an upper portion of the substrate 100 adjacent to the gate structure 118. The impurity region may include, e.g., a first impurity region 101 and a second impurity region 103. For example, the first impurity region 101 may be formed between the gate structures 118 neighboring each other. The second impurity region 103 may be formed at the upper portion of the substrate 100 on the opposite side of the first impurity region 101 with respect to the gate structure 118.

In some embodiments, the first impurity region 101 and the second impurity region 103 may serve as a source region and a drain region, respectively.

Accordingly, a transistor structure including the gate structure 118 and the impurity regions 101 and 103 may be disposed on the substrate 100, and the circuit device may include a switching device such as the transistor structure.

A first insulating interlayer 125 may be formed on the substrate 100 to cover the gate structure 118 and the impurity regions 101 and 103.

A first contact 131 and a second contact 133 may be electrically connected to the first impurity region 101 and the second impurity region 103, respectively, through the first insulating interlayer 125.

A first conductive line 142 and a second conductive line 144 may be electrically connected to the first contact 131 and the second contact 133, respectively, on the first insulating interlayer 125. The first contact 131, the second contact 133, the first conductive line 142 and the second conductive line 144 may include a metal such as copper, tungsten or aluminum, or a metal nitride.

In example embodiments, the first conductive line 142 may serve as a common source line (CSL) of the magnetic memory device.

A second insulating interlayer 146 may be formed on the first insulating interlayer 125 to cover the first and second conductive lines 142 and 144.

The lower electrode 148 may extend partially through the second insulating interlayer 146, and may be electrically connected to or in contact with the second conductive line 144. The lower electrode 148 may have a tile shape or a pillar shape, a cross-section of which may be circular or polygonal.

In example embodiments, a plurality of the lower electrodes 148 may be arranged to form a lower electrode array. For example, the plurality of the lower electrodes 148 may be arranged in first and second directions parallel to the top surface of the substrate 100 and crossing each other. For example, the first and second directions may be perpendicular to each other. The definitions of the directions may be the same throughout all the figures in the specification.

In some embodiments, the second conductive line 144 may extend in the second direction, and a plurality of the second conductive lines 144 may be arranged along the first direction. In this case, a plurality of the lower electrodes 148 may be arranged on each second conductive line 144.

In some embodiments, a plurality of the second conductive lines 144 may be patterned along the second direction. In this case, the lower electrode 148 may be provided per each of the second conductive lines 144.

The lower electrode 148 may include a metal such as titanium or tantalum, and/or a metal nitride such as a titanium nitride or tantalum nitride.

In some embodiments, the lower electrode 148 may have a diameter or a width less than about 30 nm. For example, the lower electrode 148 may have the diameter or the width less than about 20 nm. In some embodiments, the lower electrode 148 may have the diameter or the width ranging from about 10 nm to about 20 nm.

The MTJ structure 180 may be disposed on the lower electrode 148 and the second insulating interlayer 146. The MTJ structure 180 may include a first magnetic layer 150, a tunnel barrier layer 160 and a second magnetic layer 170 sequentially stacked on the lower electrode 148 and the second insulating interlayer 146.

The first magnetic layer 150 may be provided commonly on a plurality of the lower electrodes 148. For example, the first magnetic layer 150 may have a plate shape extending in the first and second directions. The tunnel barrier layer 160 and the second magnetic layer 170 may also have a plate shape substantially the same as or similar to that of the first magnetic layer 150. Accordingly, the MTJ structure 180 may have a plate shape provided commonly on the plurality of the lower electrodes 148 and extending in the first and second directions.

In example embodiments, the first magnetic layer 150 may include a plurality of first magnetic material patterns 152 and a plurality of insulation material patterns 154.

The first insulation material patterns 154 may be distributed throughout the first magnetic layer 150 randomly or regularly.

The first insulation material pattern 154 may have, e.g., a ring shape, a hollow cylindrical shape, a net shape or a mesh shape. The first insulation material pattern 154 may include an oxide, a nitride or oxynitride. For example, the first insulation material pattern 154 may include silicon oxide, silicon nitride or silicon oxynitride.

The first magnetic material patterns 152 may be segmented by the first insulation material pattern 154 to be insulated or physically separated from each other. For example, the first insulation material pattern 154 may form a boundary between the neighboring first magnetic material patterns 152.

In some embodiments, the first magnetic material pattern 152 may be formed in the first insulation material pattern 154 and/or between the neighboring first insulation material patterns 154.

In some embodiments, the first magnetic layer 150 may serve as a free layer having a variable magnetization direction. In this case, the first magnetic material pattern 152 may include a ferromagnetic material such as iron (Fe), cobalt (Co), chrome (Cr), nickel (Ni), platinum (Pt), or the like. The first magnetic material pattern 152 may further include boron (B) or silicon. These may be used alone or in a combination thereof. For example, the first magnetic material pattern 152 may include a composite such as CoFe, NiFe, FeCr, CoFeNi, PtCr, CoCrPt, CoFeB, NiFeSiB, CoFeSiB, or the like.

The tunnel barrier layer 160 may include an insulative metal oxide. In some embodiments, the tunnel barrier layer 160 may include magnesium oxide (MgOx) or aluminum oxide (AlOx). An insulative tunnel barrier in which a quantum mechanical tunneling may occur between the first and second magnetic layers 150 and 170 may be defined by the tunnel barrier layer 160.

In some embodiments, the second magnetic layer 170 may serve as a fixed layer having a fixed magnetization direction. The second magnetic layer 170 may include, e.g., ferromanganese (FeMn), iridium manganese (IrMn), platinum manganese (PtMn), manganese oxide (MnO), manganese sulfide (MnS), tellurium manganese (MnTe), manganese fluoride ($MnF_2$), iron fluoride ($FeF_2$), iron chloride ($FeCl_2$), iron oxide (FeO), cobalt chloride ($CoCl_2$), cobalt oxide (CoO), nickel chloride ($NiCl_2$), nickel oxide (NiO) or the like. These may be used alone or in a combination thereof.

A third insulating interlayer 185 may be formed on the second magnetic layer 170. The third insulating interlayer 185 may cover the second magnetic layer 170, and a plurality of the upper electrode 187 may be included in the third insulating interlayer 185. The upper electrode 187 may be in contact with or electrically connected to the second magnetic layer 170. In some embodiments, an additional magnetic layer or a buffer layer including a metal nitride may be further formed between the upper electrode 187 and the second magnetic layer 170. The upper electrode 187 may include a metal such as titanium or tantalum, and/or a metal nitride such as titanium nitride or tantalum nitride.

In example embodiments, the upper electrode 187 may substantially overlap the lower electrode 148 in a vertical direction. The plurality of the upper electrodes 187 may be arranged according to an arrangement of the plurality of the lower electrodes 148. Accordingly, an upper electrode array substantially comparable to the lower electrode array may be defined.

In example embodiments, a memory cell may be defined by a portion of the MTJ structure 180 between the upper electrode 187 and the lower electrode 148 facing in the vertical direction. In this case, a portion of the first magnetic material patterns 152 formed on a top surface of the lower electrode 148 may be defined as a first cell pattern 156. For example, the first magnetic material patterns 152 included in an area indicated by a small dotted rectangle may be provided as the first cell pattern 156.

A remaining portion of the first magnetic material patterns 152 except for the cell patterns 156 may be defined as a first dummy magnetic pattern 158. For example, the first magnetic material patterns 152 included in an area indicated by a large dotted rectangle may be provided as the first dummy magnetic pattern 158.

In example embodiments, the first magnetic material patterns 152 may be segmented by the first insulation material patterns 154 distributed in the first magnetic layer 150, and may be insulated or physically separated from each other. Thus, the first cell patterns 156 and the first dummy magnetic patterns 158 may be divided in the first magnetic layer 150 by the first insulation material patterns 154. Therefore, processes of etching the first magnetic layer 150 and forming a first magnetic layer pattern on the lower electrode 148 may be omitted.

In a comparative example, for a formation of the memory cell interposed between the lower electrode 148 and the upper electrode 187, the first magnetic layer 150, the tunnel barrier layer 160 and the second magnetic layer 170 may be etched to form an MTJ pattern having, e.g., a pillar shape. A sidewall of each MTJ pattern may be damaged by the etching process, and an etching residue may be attached to the sidewall of the each MTJ pattern. In this case, a spin torque or a resistance of the MTJ pattern may be disturbed to result in a deterioration of a reliability in the magnetic memory device. Additionally, when a degree of integration of the memory cells becomes more increased, a dimension of each memory cell and a distance between the neighboring memory cells may be reduced to less than about 30 nm or about 20 nm. In this case, the etching damage of the MTJ pattern may be exacerbated, and some of the MTJ patterns may not be fully separated due to a resolution limit of the etching process.

However, according to example embodiments, the first magnetic material patterns 152 may be segmented or separated by the first insulation material patterns 154 such that the memory cell may be defined without an additional etching process. Accordingly, an etching process for the tunnel barrier layer 160 and the second magnetic layer may be also omitted. Thus, the MTJ structure 180 may be provided commonly between the plurality of the lower electrodes 148 and the plurality of the upper electrodes 187 as an initial bulk-type layer stack. In this case, a current or a spin torque may be transferred or generated only at a portion of the MTJ structure 180 overlapping the lower electrode 148 and the upper electrode 187.

The bit line 190 may be electrically connected to the upper electrode 187 on the third insulating interlayer 185. The bit line 190 may include a metal such as copper, tungsten, aluminum or titanium, or a metal nitride.

In some embodiments, the bit line 190 may extend in the second direction and may be electrically connected to a plurality of the upper electrodes 187 arranged along the second direction. A plurality of bit lines 190 may be arranged along the first direction.

In some embodiments, the bit line 190 may extend in the first direction, and a plurality of the bit lines 190 may be arranged along the second direction.

Figure 2:
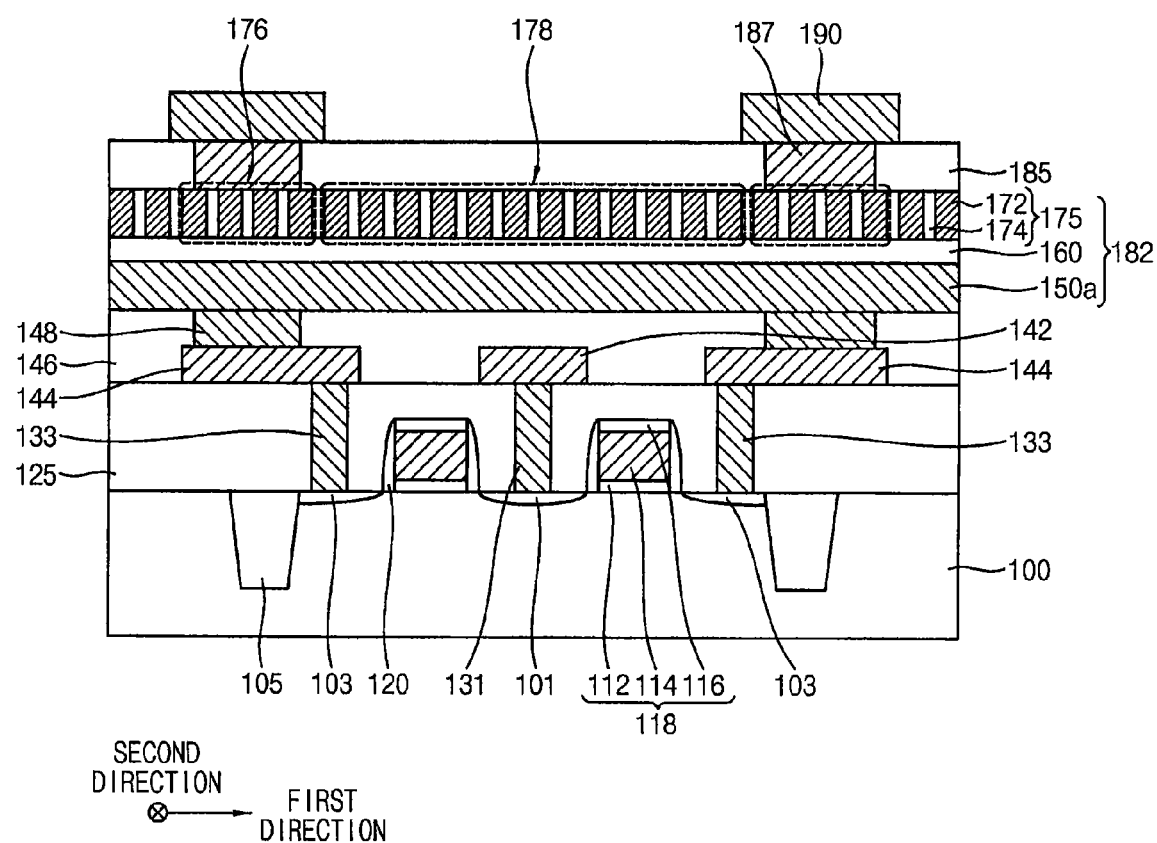
Figure 3:
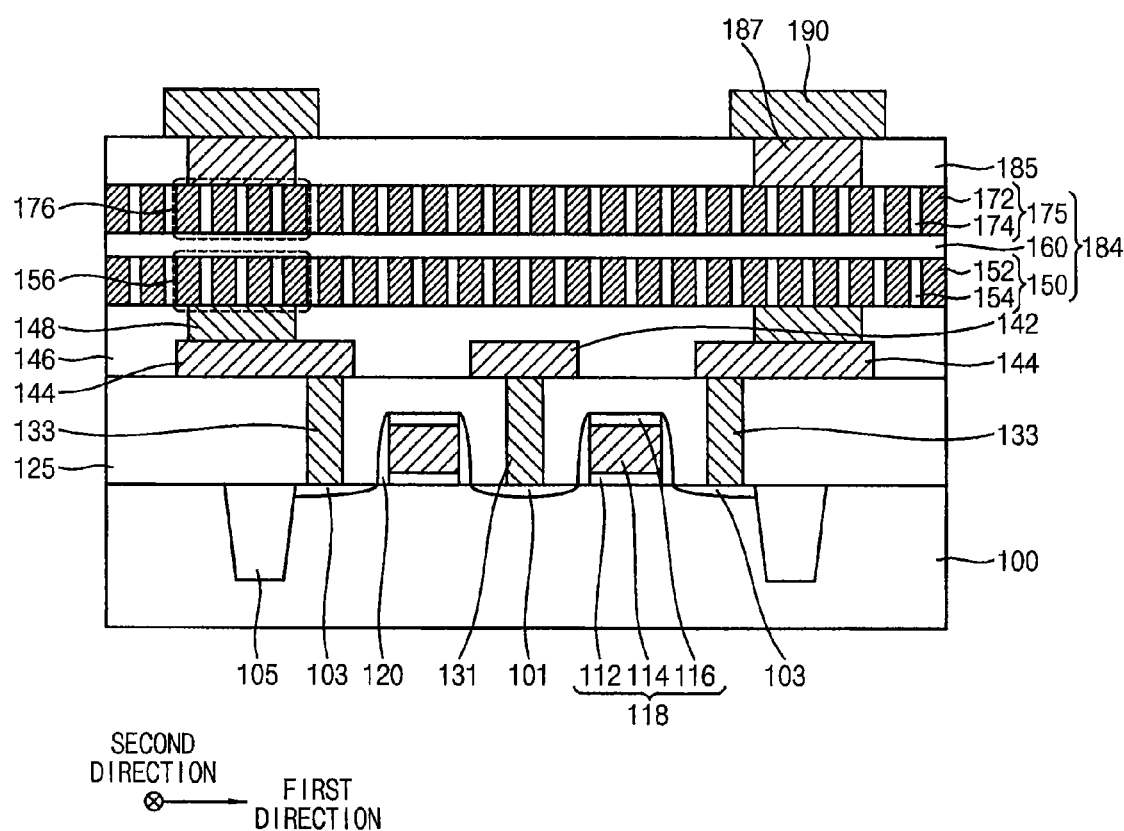

FIGS. 2 and 3 cross-sectional views illustrating magnetic memory devices in accordance with some example embodiments.

Detailed descriptions on elements and/or constructions substantially the same as or similar to those illustrated with reference to FIG. 1 are omitted herein. Like reference numerals are used to designate like elements.

Referring to FIG. 2, in an MTJ structure 182, an insulation material pattern and a magnetic material pattern illustrated in FIG. 1 may be formed in a second magnetic layer 175. In this case, the second magnetic layer 175 may include second magnetic material patterns 172 and second insulation material patterns 174.

In some embodiments, the second magnetic material pattern 172 and the second insulation material pattern 174 may have arrangements, structures and/or compositions substantially the same as or similar to those of the first magnetic material pattern 152 and the first insulation material pattern 154, respectively, illustrated with reference to FIG. 1. For example, the second magnetic layer 175 and a first magnetic layer 150a may serve as a free layer and a fixed layer, respectively, of the magnetic memory device.

In some embodiments, the second magnetic layer 175 may serve as a fixed layer, and the first magnetic layer 150a may serve as a free layer.

The second magnetic material patterns 172 included in the second magnetic layer 175 may be divided into a second cell pattern 176 (indicated by a small dotted rectangle) and a second dummy magnetic pattern 178 (indicated by a large dotted rectangle). For example, a portion of the second magnetic material patterns 172 overlapping or contacting a bottom of an upper electrode 187 may be defined as the second cell pattern 176, and a remaining portion of the second magnetic material patterns 172 except for the second cell pattern 176 may be defined as the second dummy magnetic material pattern 178.

Referring to FIG. 3, an MTJ structure 184 may include a first magnetic layer 150 substantially the same as or similar to that of FIG. 1, and a second magnetic layer 175 substantially the same as or similar to that of FIG. 2.

Accordingly, the first magnetic layer 150 may include first magnetic material patterns 152 segmented by first insulation material patterns 154. The second magnetic layer 175 may include second magnetic material patterns 172 segmented by second insulation material patterns 174.

As illustrated in FIG. 3, a first cell pattern 156 and a second cell pattern 176 may be disposed between a lower electrode 148 and an upper electrode 187 to define a memory cell. In this case, boundaries of the magnetic material patterns may be formed by the insulation material patterns in both of the first magnetic layer 150 and the second magnetic layer 175, so that an operational reliability of the magnetic memory device may be further enhanced.

FIGS. 4 to 11 are cross-sectional views and plan views illustrating a method of manufacturing a magnetic memory device in accordance with example embodiments.

Figure 8:
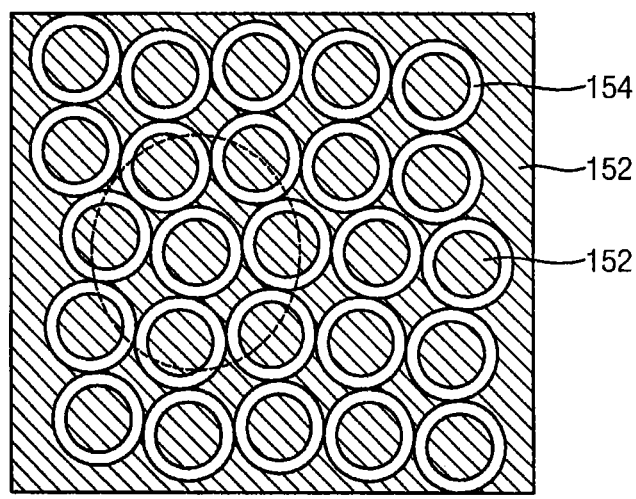
Figure 9:
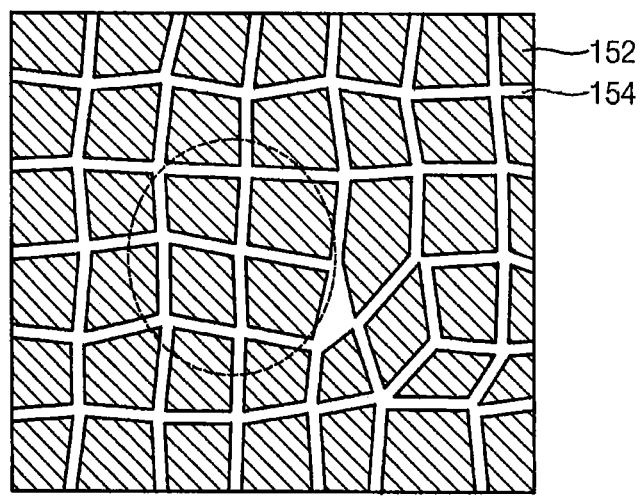

Specifically, FIGS. 4 to 7, 10 and 11 are cross-sectional views illustrating the method of manufacturing the semiconductor device. FIGS. 8 and 9 are plan views illustrating arrangements of first magnetic material patterns and first insulation material patterns.

Figure 4:
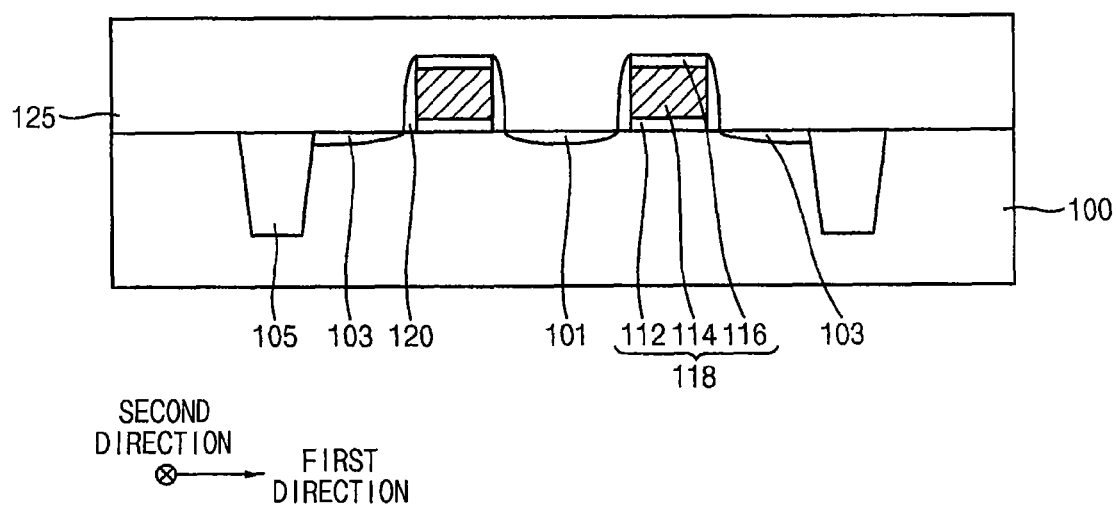

Referring to FIG. 4, an isolation layer 105 may be formed on a substrate 100, and a transistor structure may be formed on an active region of the substrate 100.

The substrate 100 may include silicon, germanium, silicon-germanium or a group III-V compound such as GaP, GaAs, GaSb, etc. In some embodiments, the substrate 100 may be an SOI substrate or a GOI substrate.

The isolation layer 105 may be formed by a shallow trench isolation (STI) process. The substrate 100 may be divided by an active region and a field region by the formation of the isolation layer 105. The isolation layer 105 may be formed of an insulative material such as silicon oxide.

A gate insulation layer, a gate electrode layer and a gate mask layer may be sequentially formed on a top surface of the substrate 100. The gate mask layer may be etched to form a gate mask pattern 116, and then the gate electrode layer and the gate insulation layer may be patterned using the gate mask pattern 116. Accordingly, a gate structure 118 including a gate insulation layer pattern 112, a gate electrode 114 and the gate mask pattern 116 sequentially stacked on the top surface of the substrate 100 may be formed.

For example, the gate insulation layer may be formed of a metal oxide or silicon oxide. The gate electrode layer may be formed of a metal, a metal silicide or a metal nitride. The gate mask layer may be formed of silicon nitride. The gate insulation layer, the gate electrode layer and the gate mask layer may be formed by a chemical vapor deposition (CVD) process, an atomic layer deposition (ALD) process, a sputtering process and a physical vapor deposition (PVD), etc. The gate insulation layer may be formed by a thermal oxidation process on the top surface of the substrate 100.

A gate spacer 120 may be further formed on a sidewall of the gate structure 118. For example, a spacer layer covering the gate structure 118 may be formed using silicon nitride on the substrate 100. The spacer layer may be anisotropically etched to form the gate spacer 120.

An ion-implantation process may be performed using the gate structure 118 as an implantation mask to form a first impurity region 101 and a second impurity region 103 at upper portions of the substrate 100 adjacent to the gate structure 118.

Accordingly, the transistor structure including the gate structure 118 and the impurity regions 101 and 103 may be formed on the active region of the substrate 100. The gate electrode 114 may serve as a word line of the magnetic memory device.

FIG. 4 illustrates that the gate structure 118 is formed on the top surface of the substrate 100. However, the gate structure 118 may be at least partially buried in the substrate 100.

A first insulating interlayer 125 covering the transistor structure may be formed on the substrate 100. The first insulating interlayer 125 may be formed of a silicon oxide-based material such as plasma enhanced oxide (PEOX), a tetraethyl orthosilicate (TEOS), boro silicate glass (BSG), phospho silicate glass (PSG), boro phospho silicate glass (BPSG), or the like by, e.g., a CVD process, an ALD process or a spin coating process.

Figure 5:
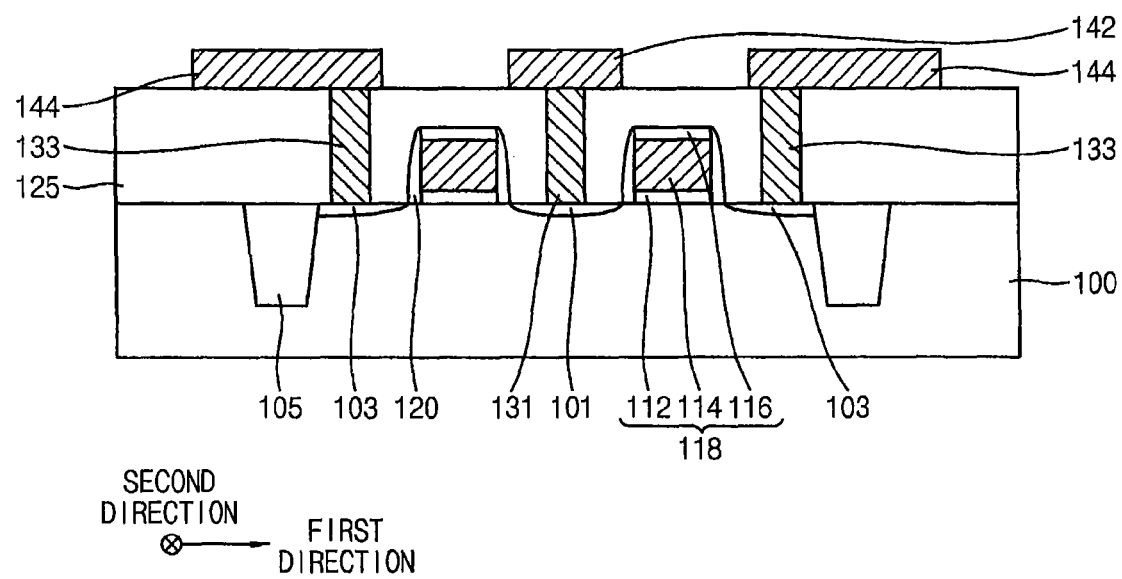

Referring to FIG. 5, contacts and conductive lines electrically connected to the impurity regions 101 and 103 may be formed In example embodiments, the first insulating interlayer 125 may be partially removed to form a first contact hole and a second contact hole through which the first impurity region 101 and a second impurity region 103 may be exposed, respectively. A contact conductive layer sufficiently filling the first and second contact holes may be formed on the first insulating interlayer 125. An upper portion of the contact conductive layer may be planarized until a top surface of the first insulating interlayer 125 is exposed by, e.g., a chemical mechanical polish (CMP) process such that a first contact 131 and a second contact 133 may be formed in the first contact hole and the second contact hole, respectively. The first contact 131 and the second contact 133 may be in contact with the first impurity region 101 and the second impurity region 103, respectively.

In some embodiments, a plurality of the first contacts 131 and a plurality of the second contacts 133 may be formed along the second direction.

A first conductive layer may be formed on the first insulating interlayer 125, the first contact 131 and the second contact 133, and then may be patterned to form a first conductive line 142 and a second conductive line 144.

The first conductive line 142 may extend in the second direction, and may be electrically connected to the plurality of the first contacts 131. The first conductive line 142 may serve as a CSL of the magnetic memory device.

In some embodiments, the second conductive line 144 may extend in the second direction, and may be electrically connected to the plurality of the second contacts 133.

In some embodiments, the second conductive line 144 may be patterned per each second contact 133. In this case, a plurality of the second conductive lines 144 may be formed along the second direction.

The contact conductive layer and the first conductive layer may be formed of a metal such as copper, tungsten or aluminum, or a metal nitride by a sputtering process, an ALD process, a PVD process or the like.

Figure 6:
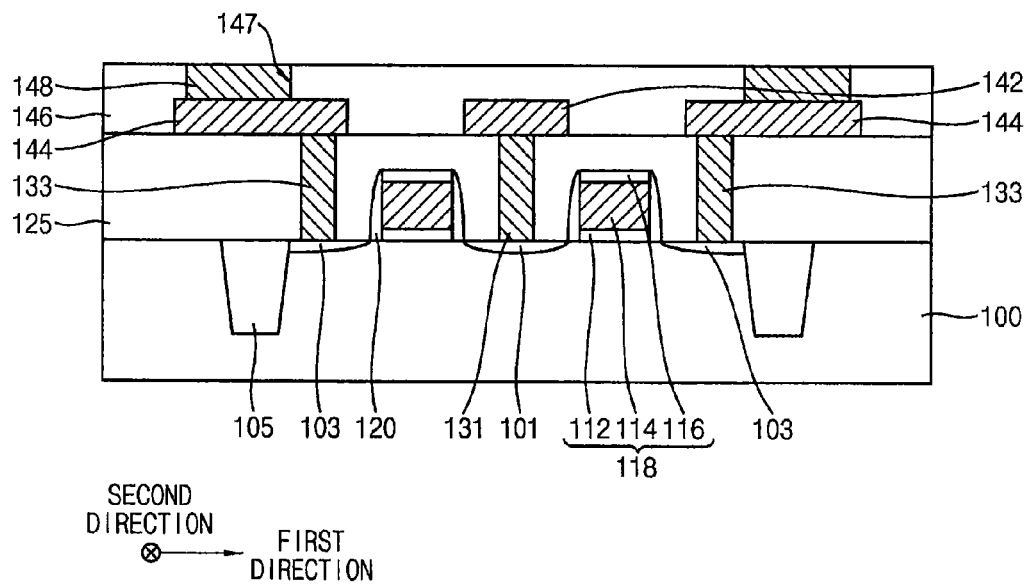

Referring to FIG. 6, a second insulating interlayer 146 covering the first and second conductive lines 142 and 144 may be formed on the first insulating interlayer 125. A lower electrode 148 electrically connected to the second conductive line 144 may be formed in the second insulating interlayer 146.

The second insulating interlayer 146 may be formed of a silicon oxide-based material substantially the same as or similar to that of the first insulating interlayer 125.

In example embodiments, the second insulating interlayer 146 may be partially removed to form a recess 147 through which the second conductive line 144 may be partially exposed. For example, a plurality of recesses 147 may be formed along the second direction to form a recess row. A plurality of the recess rows may be formed along the first direction.

A lower electrode layer filling the recesses 147 may be formed on the second conductive line 144 and the second insulating interlayer 146. An upper portion of the lower electrode layer may be planarized until a top surface of the second insulating interlayer 146 is exposed by, e.g., a CMP process to form the lower electrode 148. The lower electrode 148 may have a tile shape or a pillar shape, a cross-section of which may be circular or polygonal.

According to an arrangement of the recess 147, a plurality of the lower electrodes 148 may be formed along the second direction such that a lower electrode row may be formed. A plurality of the lower electrode rows may be formed along the first direction.

In some embodiments, the plurality of the lower electrodes 148 may be formed on one of the second conductive lines 144 along the second direction. In some embodiments, one lower electrode 148 may be formed on each of the second conductive lines 144.

In some embodiments, the lower electrode 148 may have a diameter or a width not greater than about 30 nm. For example, the lower electrode 148 may have the diameter or the width not greater than about 20 nm. In some embodiments, the lower electrode 148 may have the diameter or the width ranging from about 10 nm to about 20 nm.

Figure 7:
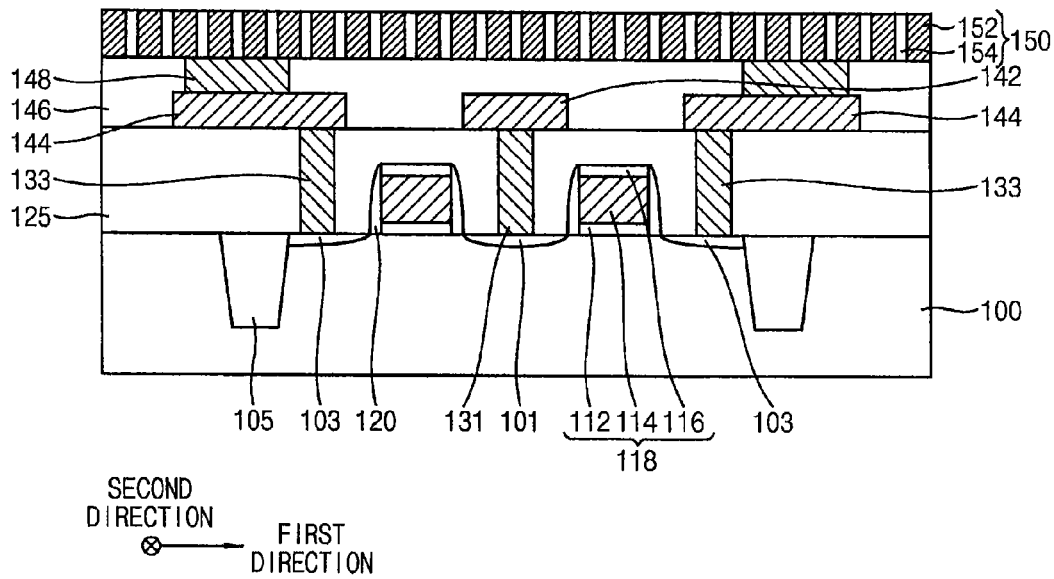

Referring to FIG. 7, a first magnetic layer 150 covering a plurality of the lower electrodes 148 may be formed on the second insulating interlayer 146. For example, the first magnetic layer 150 may serve as a free layer of the magnetic memory device.

In example embodiments, the first magnetic layer 150 may be formed by a deposition process, e.g., a sputtering process in which a ferromagnetic metal target including, e.g., cobalt, iron, nickel, chrome, platinum or the like may be used. The sputtering process may be performed in an atmosphere of oxygen, nitrogen or a combination thereof. For example, a silicon precursor such as silane or dichloro silane may be provided into a sputtering process chamber in a presence of an oxygen gas and/or a nitrogen gas.

In this case, a first magnetic material pattern 152 and a first insulation material pattern 154 may be formed simultaneously or concurrently by substantially the same deposition process. For example, the ferromagnetic metal such as cobalt, iron, nickel, chrome or platinum may be deposited to form the first magnetic material pattern 152. Silicon oxide, silicon nitride or silicon oxynitride may be aggregated between the neighboring first magnetic material patterns 152 to form a grain boundary. Accordingly, the first insulation material patterns 154 by which the first magnetic material patterns 152 may be segmented or separated may be formed.

Referring to FIG. 8, the first insulation material pattern 154 may be formed as a ring shape or a hollow cylindrical shape. In this case, the first magnetic material pattern 152 may be formed in the first insulation material pattern 154 and in a space between the neighboring first insulation material patterns 154. Portions of the first magnetic material patterns 152 contacting or overlapping the lower electrode 148 (indicated by a dotted circle) under the first magnetic layer 150 may be defined as a cell pattern. Remaining first magnetic material patterns 152 except for the cell pattern may be defined as a dummy magnetic pattern.

Referring to FIG. 9, the first insulation material pattern 154 may be formed as a net structure or a mesh structure. In this case, the first magnetic material pattern 152 may be formed in holes included in the net structure or the mesh structure.

In some embodiments, the first insulation material pattern 154 may have a line width ranging from about 1 nm to about 3 nm. The first magnetic material pattern 152 may have a diameter or a width ranging from about 4 nm to about 6 nm.

Figure 10:
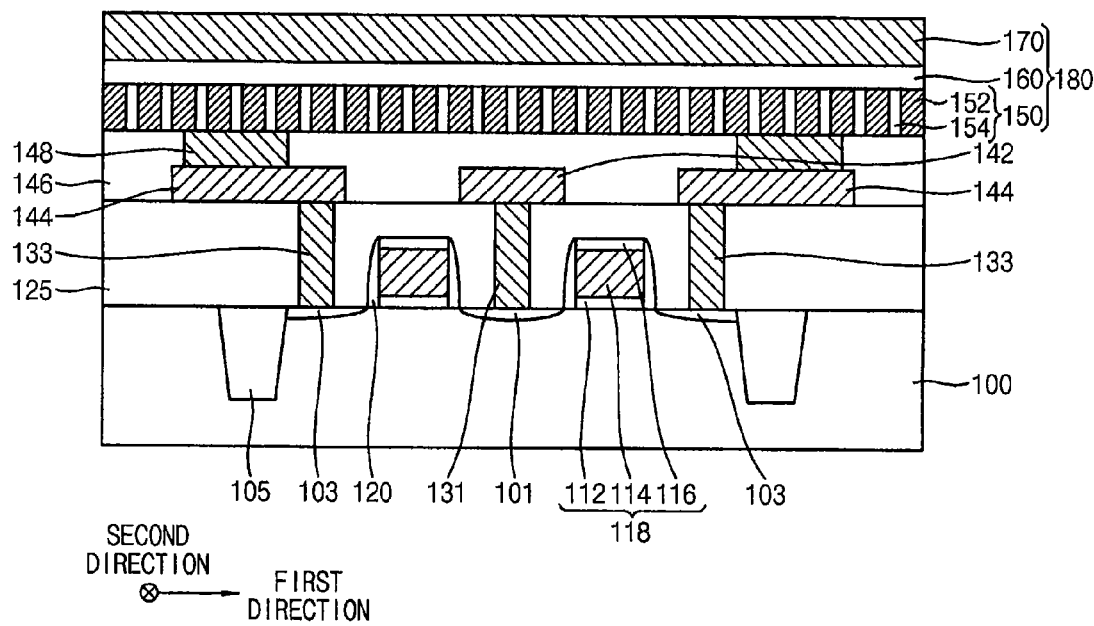

Referring to FIG. 10, a tunnel barrier layer 160 and a second magnetic layer 170 may be sequentially formed on the first magnetic layer 150. Accordingly, an MTJ structure 180 may be formed commonly on a plurality of the lower electrodes 148. The MTJ structure 180 may have a plate shape extending in the first and second directions.

The tunnel barrier layer 160 may be formed of an insulative metal oxide such as magnesium oxide or aluminum oxide.

The second magnetic layer 170 may be formed of FeMn, IrMn, PtMn, MnO, MnS, MnTe, $MnF_2$, $FeF_2$, $FeCl_2$, FeO, $CoCl_2$, CoO, $NiCl_2$, NiO or the like. The second magnetic layer 170 may serve as a fixed layer of the magnetic memory device.

The tunnel barrier layer 160 and the second magnetic layer 170 may be formed by, e.g., a sputtering process or an ALD process.

In some embodiments, as illustrated in FIG. 2, a second magnetic layer 175 may be formed by a process substantially the same as or similar to that for the first magnetic layer 150. In this case, the second magnetic layer 175 may include a second magnetic material pattern 172 and a second insulation material pattern 174 separating or segmenting the second magnetic material pattern 172.

In some embodiments, as illustrated in FIG. 3, both the first magnetic layer 150 and the second magnetic layer 175 may include the magnetic material patterns and the insulation material patterns.

In some embodiments, the first magnetic layer 150 may serve as a fixed layer, and the second magnetic layer 170 and 175 may serve as a free layer.

Figure 11:
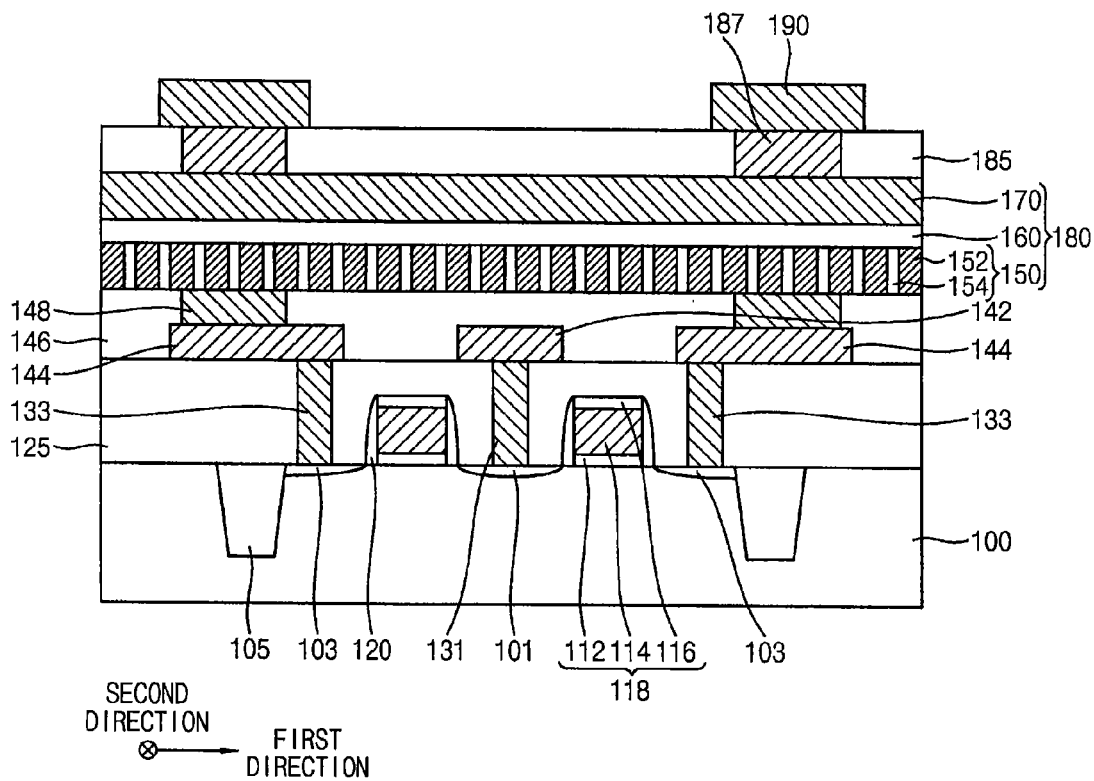

Referring to FIG. 11, a plurality of upper electrodes 187 may be formed on the MTJ structure 180, and a bit line 190 electrically connected to the upper electrodes 187 may be formed.

For example, a third insulating interlayer 185 may be formed on the second magnetic layer 170. The third insulating interlayer 185 may be formed of a silicon oxide-based material substantially the same as or similar to that for the first insulating interlayer 125.

The third insulating interlayer 185 may be partially removed to form a plurality of holes through which the second magnetic layer 170 may be partially exposed. An upper electrode layer sufficiently filling the holes may be formed on the third insulating interlayer 185. An upper portion of the upper electrode layer may be planarized until a top surface of the third insulating interlayer 185 is exposed to form the upper electrodes 187.

The upper electrode layer may be formed of a metal such as titanium or tantalum, and/or a metal nitride such as titanium nitride or tantalum nitride by a sputtering process, an ALD process or a CVD process.

In some embodiments, the upper electrode layer may be formed, the upper electrode layer may be etched to form the upper electrodes 187, and then the third insulating interlayer 185 filling spaces between the upper electrodes 187 may be formed on the MTJ structure 180.

In example embodiments, the upper electrode 187 may be superimposed over the lower electrode 148 in a vertical direction. Accordingly, a memory cell may be defined by a pair of the upper electrode 187 and the lower electrode 148 facing each other, and a portion of the MTJ structure 180 between the upper electrode 187 and the lower electrode 148. A plurality of the memory cells may be formed along the first and second directions.

According to example embodiments, the MTJ structure 180 may be provided commonly for a plurality of the memory cells, and thus an etching process for a formation of an MTJ pattern may be omitted.

The bit line 190 may be formed on the third insulating interlayer 185 to be electrically connected to a plurality of the upper electrodes 187. The bit line 190 may be formed of a metal such as copper, tungsten, aluminum, titanium, or a metal nitride by a sputtering process or an ALD process. The bit line 190 may extend in the first direction or the second direction.

Figure 12:
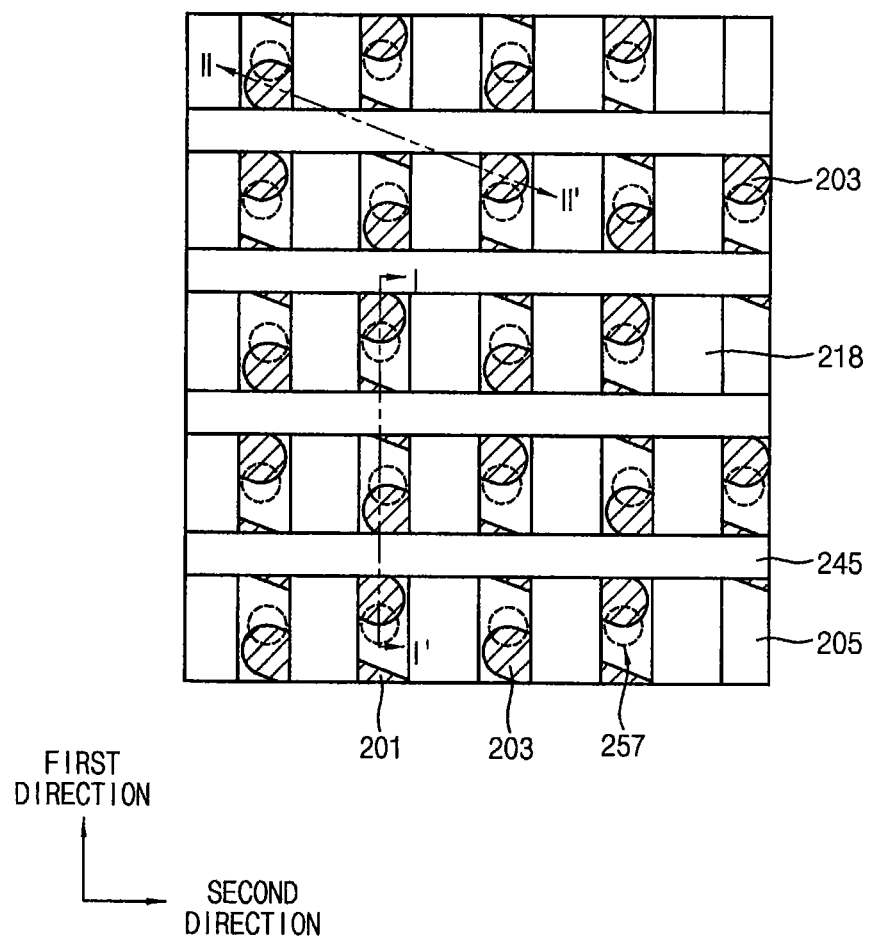
Figure 13:
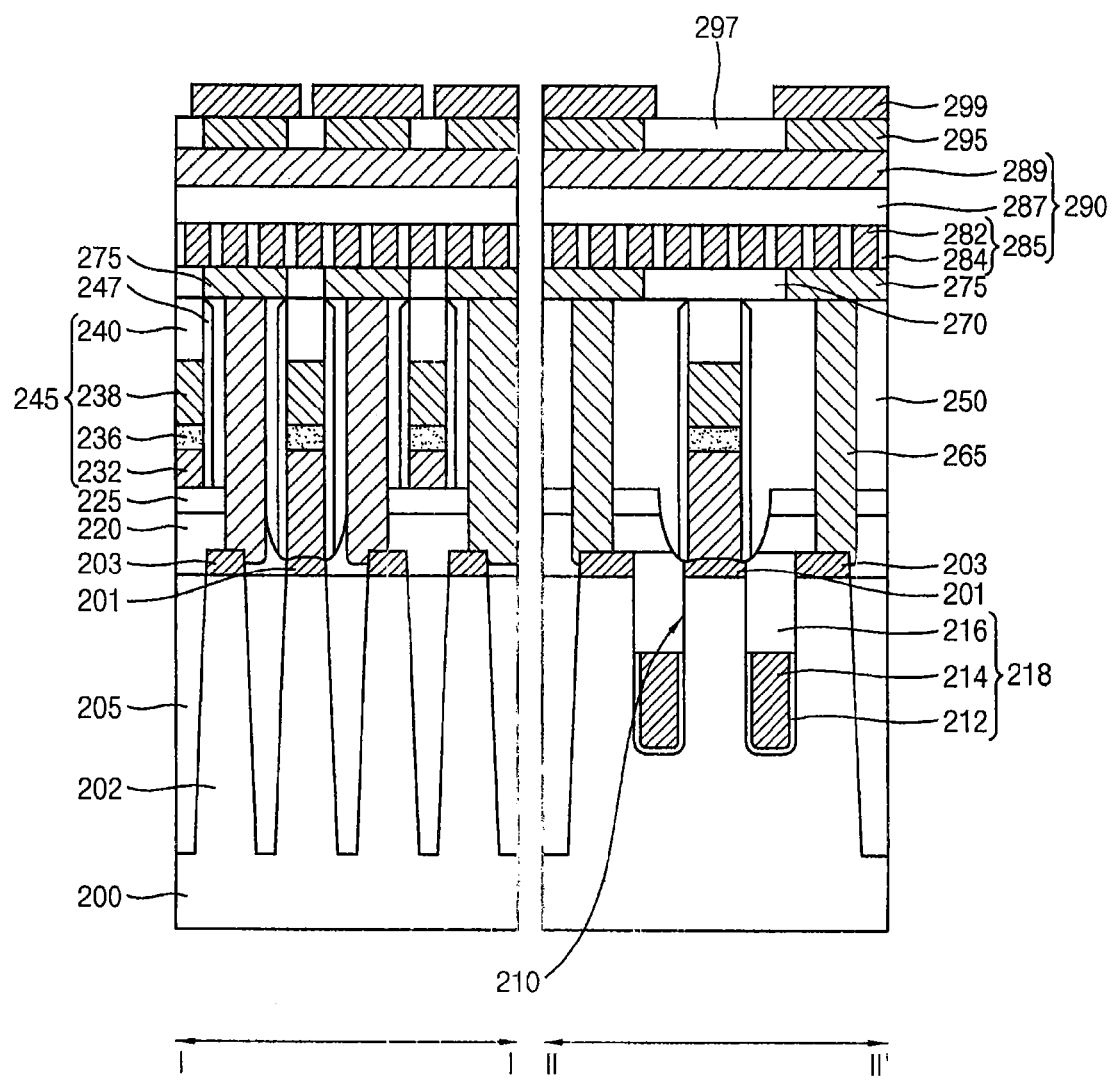

FIGS. 12 and 13 are a plan view and a cross-sectional view, respectively, illustrating a magnetic memory device in accordance with example embodiments. FIG. 13 includes sub-cross sectional views taken along lines I-I' and II-II' indicated in FIG. 12.

For example, FIGS. 12 and 13 illustrate the magnetic memory device including a buried cell array transistor (BCAT) structure that may include a buried gate.

For convenience of descriptions, an isolation layer 205, impurity regions 201 and 203, a conductive line structure 245 and a gate structure 218 are only illustrated in FIG. 12. Detailed descriptions on elements and/or constructions substantially the same as or similar to those illustrated with reference to FIGS. 1 to 3 are omitted herein.

Referring to FIGS. 12 and 13, the magnetic memory device may include a substrate 200, active patterns 202, and gate structures 218 extending through upper portions of the active patterns 202 and an isolation layer 205.

The active pattern 202 may have an island shape confined by the isolation layer 205. For example, the active pattern 202 may extend in a diagonal direction relative to a first direction and a second direction. The first and second directions are parallel to a top surface of the substrate 200 and may be perpendicular to each other. A plurality of the active patterns 202 may be formed along the first and second directions.

The gate structure 218 may extend in the first direction and in the active patterns 202 and the isolation layer 205. A plurality of the gate structures 218 may be arranged along the second direction.

The gate structures 218 may be buried or embedded in the active pattern 202 and the isolation layer 205. For example, the gate structure 218 may fill a gate trench 210 formed in the upper portion of the active pattern 202.

The gate structure 218 may include a gate insulation layer pattern 212, a gate electrode 214 and a gate mask pattern 216 sequentially stacked from a bottom of the gate trench 210. For example, the gate insulation layer pattern 212 may be formed on a surface of the active pattern 202 exposed by the gate trench 210, and the gate electrode 214 may be formed on the gate insulation layer pattern 212 to fill a lower portion of the gate trench 210. The gate mask pattern 216 may be formed on the gate insulation layer pattern 212 and the gate electrode 214 to cap or close an upper portion of the gate trench 210.

In example embodiments, two gate structures 218 may extend through each active pattern 202. Accordingly, the upper portion of the active pattern 202 may be divided into a central portion and two peripheral portions by the two gate structures 218.

A first impurity region 201 and a second impurity region 203 may be formed at the central portion and the peripheral portion, respectively, of the active pattern 202. For example, the each active pattern 202 may include the first impurity region 201 between the two gate structures 218, and two second impurity regions 203 on the opposite sides of the first impurity region 201 with respect to the gate structure 218.

A capping layer 220 may be formed on the impurity regions 201 and 203, and a first insulating interlayer 225 and a second insulating interlayer 250 may be stacked on the capping layer 220. For example, the capping layer 220 may include silicon nitride, the first and second insulating interlayers 225 and 250 may include silicon oxide.

A conductive line structure 245 may be disposed on the central portion of the active pattern 202. The conductive line structure 245 may extend in the second direction and may be electrically connected to a plurality of the first impurity regions 201. The conductive line structure 245 may serve as a CSL of the magnetic memory device.

The conductive line structure 245 may extend through the second insulating interlayer 250, and may include a first conductive layer pattern 232, a barrier conductive layer pattern 236 and a second conductive layer pattern 238 sequentially stacked from the first impurity region 201.

In example embodiments, the first conductive layer pattern 232 may include doped polysilicon. The barrier conductive layer pattern 236 may include a metal nitride or a metal silicide nitride. For example, the barrier conductive layer pattern 236 may include titanium nitride (TiN), titanium silicide nitride (TiSiN), tantalum nitride (TaN) or tantalum silicide nitride (TaSiN). The second conductive layer pattern 238 may include a metal such as copper or tungsten. In some embodiments, the first conductive layer pattern 232 may be omitted.

In some embodiments, the conductive line structure 245 may further include a mask pattern 240 disposed on the second conductive layer pattern 238. The mask pattern 240 may include, e.g., silicon nitride.

A spacer 247 may be further formed on a sidewall of the conductive line structure 245 such that an insulation between the conductive line structure 245 and a lower electrode contact 265 may be ensured.

The lower electrode contact 265 may be formed at each contact region 257 indicated by a dotted circle in FIG. 12. The lower electrode contact 265 may extend through the second insulating interlayer 250, the first insulating interlayer 225 and the capping layer 220, and may be in contact with the second impurity region 203. The lower electrode contact 265 may include a metal such as copper, aluminum, tungsten or titanium, a metal nitride and/or a metal silicide. In some embodiments, the lower electrode contact 265 may include doped polysilicon.

In some embodiments, a barrier conductive layer including a metal nitride such as titanium nitride may be further formed on a bottom and a sidewall of the lower electrode contact 265.

A lower electrode 275 may be disposed on each lower electrode contact 265. Accordingly, a plurality of the lower electrodes 275 may be arranged along the first and second directions to form a lower electrode array. A third insulating interlayer 270 may fill spaces between the lower electrodes 275 on the second insulating interlayer 250 and the mask pattern 240.

An MTJ structure 290 may be disposed on the lower electrode array and the third insulating interlayer 270. The MTJ structure 290 may have elements and/or constructions substantially the same as or similar to those of the MTJ structure 180 illustrated in FIG. 1.

In example embodiments, the MTJ structure 290 may include a first magnetic layer 285, a tunnel barrier layer 287 and a second magnetic layer 289. The first magnetic layer 285 may include first magnetic material patterns 282 and first insulation material patterns 284 distributed throughout the first magnetic layer 285.

A plurality of upper electrodes 295 may be disposed on the second magnetic layer 289. The upper electrodes 295 may form an array substantially the same as or similar to the lower electrode array.

The upper electrode 295 may substantially overlap the lower electrode 275 in a vertical direction. A memory cell may be defined by a pair of the upper electrode 295 and the lower electrode 275, and a portion of the MTJ structure 290 therebetween. Accordingly, a plurality of the memory cells may be defined along the first and second directions.

In some embodiments, a fourth insulating interlayer 297 filling spaces between the upper electrodes 295 may be formed on the second magnetic layer 289. A bit line 299 may be electrically connected to the upper electrode 295 on the fourth insulating interlayer 297.

The bit line 299 may extend in the second direction and may be electrically connected to a plurality of the upper electrodes 295. The bit line 299 may directly contact the upper electrode 295, or may be electrically connected to the upper electrode 295 via a bit line contact.

In some embodiments, the MTJ structure 290 may have elements and/or constructions substantially the same as or similar to those of the MTJ structures 182 and 184 illustrated in FIG. 2 or FIG. 3. In this case, the magnetic material patterns and the insulation material patterns may be included in the second magnetic layer 289, or in both the first and second magnetic layers 285 and 289.

According to example embodiments as described above, the MTJ structure 290 may be provided between the lower electrode array and the upper electrode array as a single unitary member. Therefore, an etching damage of an MTJ pattern may be avoided, and the magnetic memory device including the BCAT structure of a fine dimension may be effectively obtained.

Figure 14:
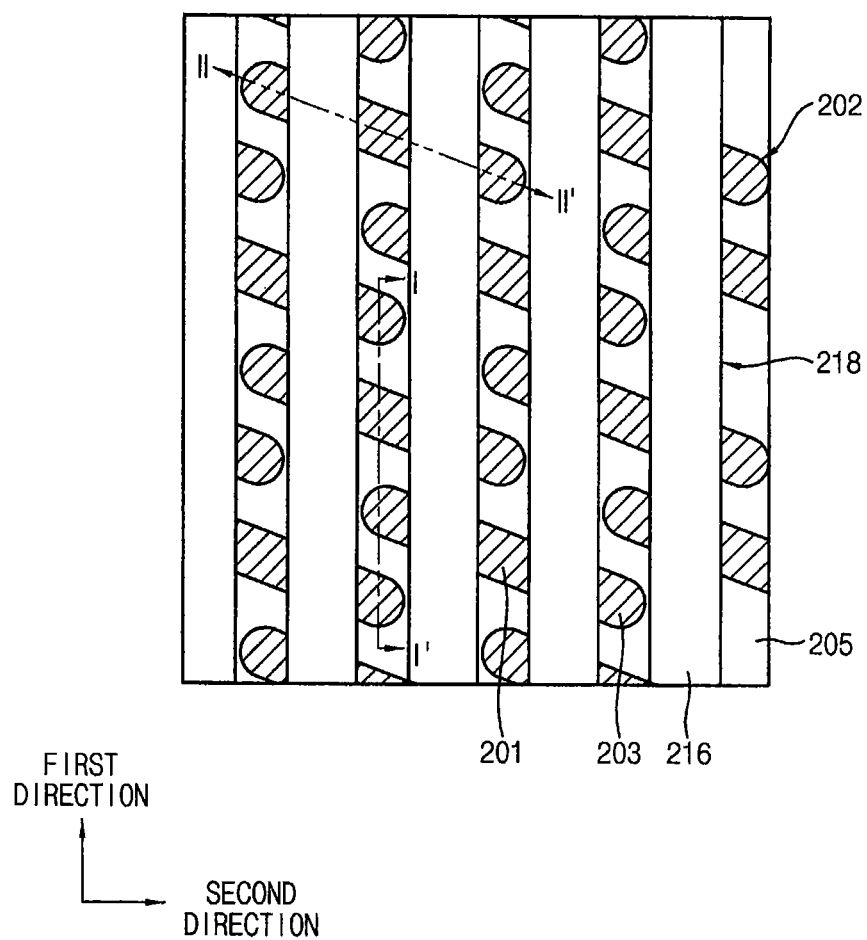

FIGS. 14 to 22 are plan views and cross-sectional views illustrating a method of manufacturing a magnetic memory device in accordance with example embodiments;

Specifically, FIG. 14 is a plan view illustrating the method, and FIGS. 15 to 22 are cross-sectional views illustrating the method. FIGS. 15 to 22 include sub-cross sectional views taken along lines I-I' and II-II' indicated in FIG. 14.

For example, FIGS. 14 to 22 illustrate a method of manufacturing the magnetic memory device illustrated in FIGS. 12 and 13. Detailed descriptions on processes substantially the same as or similar to those illustrated with reference to FIGS. 4 to 11 are omitted herein.

Figure 15:
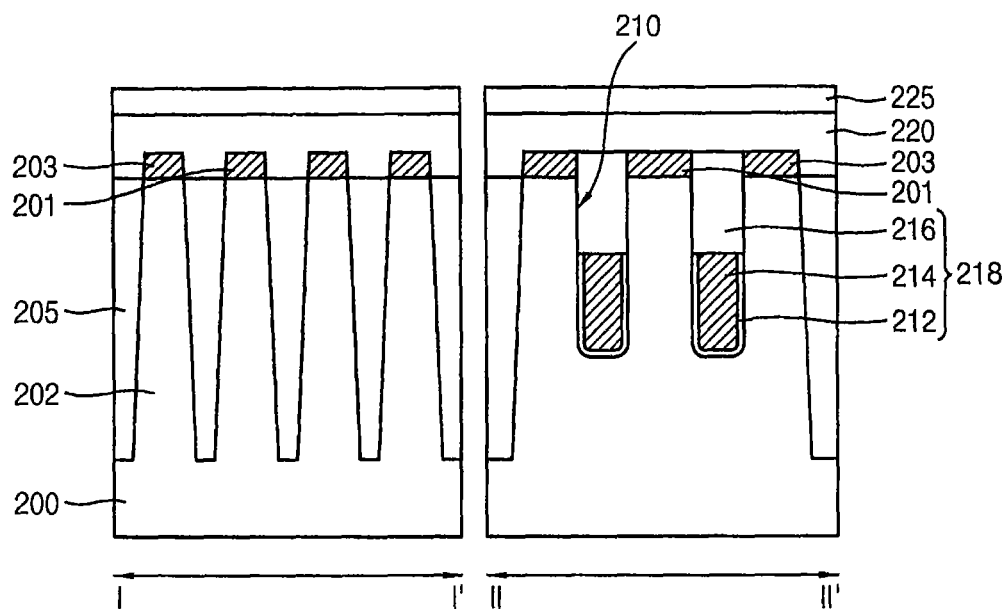

Referring to FIGS. 14 and 15, an isolation layer 205 and active patterns 202 may be formed in an upper portion of a substrate 200, and gate structures 218 extending in the active patterns 202 may be formed.

In example embodiments, the isolation layer 205 and the active pattern 202 may be formed by a shallow trench isolation (STI) process. After the formation of the isolation layer 205, a plurality of the active patterns 202 protruding from the substrate 200 and spaced apart from each other may be defined. As illustrated in FIG. 14, each active pattern 202 may extend in a diagonal direction to the first direction or the second direction by a predetermined angle. The plurality of the active patterns 202 may be arranged in the first and second directions.

Upper portions of the active patterns 202 and the isolation layer 205 may be etched to form gate trenches 210, and the gate structure 218 may be formed in each gate trench 210.

A gate insulation layer pattern 212 and a gate electrode 214 filling a lower portion of the gate trench 210 may be formed. A gate mask pattern 216 filling an upper portion of the gate trench 210 may be formed on the gate insulation layer pattern 212 and the gate electrode 214.

For example, the gate insulation layer pattern 212 may be formed by a thermal oxidation process on a surface of the active pattern 202 exposed by the gate trench 210, or by depositing silicon oxide or a metal oxide on the surface of the active pattern 202 through, e.g., a CVD process.

A gate electrode layer filling the gate trench 210 may be formed on the gate insulation layer pattern 212. The gate electrode layer may be planarized by a CMP process until a top surface of the active pattern 202 is exposed, and portions of the gate insulation layer pattern 212 and the gate electrode layer in the gate trench 210 may be removed by an etch-back process. Accordingly, the gate insulation layer pattern 212 and the gate electrode 214 filling the lower portion of the gate trench 210 may be formed.

A mask layer filling a remaining portion of the gate trench 210 may be formed on the gate insulation layer pattern 212 and the gate electrode 214, and an upper portion of the mask layer may be planarized until the top surface of the active pattern 202 is exposed to form the gate mask pattern 216. The mask layer may be formed of silicon nitride by, e.g., a CVD process.

Accordingly, the gate structure 218 including the gate insulation layer pattern 212, the gate electrode 214 and the gate mask pattern 216 sequentially stacked in the gate trench 210 may be formed.

The gate structure 218 may be buried or embedded in an upper portion of the active pattern 202. The upper portion of the active pattern 202 may be divided into a central portion between two gate structures 218, and a peripheral portion (or end portions) facing the central portion with respect to each of the gate structure 218.

An ion-implantation process may be performed to form a first impurity region 201 and a second impurity region 203 at portions of the active pattern 202 adjacent to the gate structures 218. For example, the first impurity region 201 may be formed at the central portion of the active pattern 202, and the second impurity region 203 may be formed at the peripheral portions of the active pattern 202.

In some embodiments, as illustrated in FIG. 15, an upper portion of the isolation layer 205 may be recessed by an etch-back process such that the upper portion of the active pattern 202 may be exposed. Subsequently, the ion-implantation process may be performed to form the first and second impurity regions 201 and 203.

A capping layer 220 covering the active patterns 202 and the isolation layer 205 may be formed, and a first insulating interlayer 225 may be formed on the capping layer 220. For example, the capping layer 220 and the first insulating interlayer 225 may be formed of silicon nitride and silicon oxide, respectively. The capping layer 220 may substantially serve as an etch-stop layer during subsequent etching processes.

Figure 16:
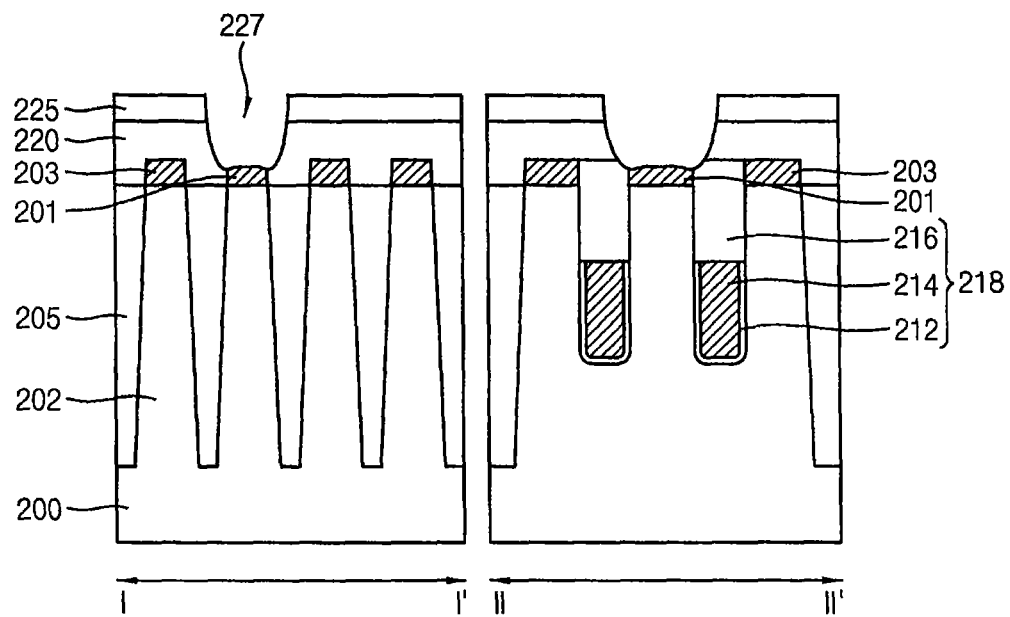

Referring to FIG. 16, the first insulating interlayer 225 and the capping layer 220 may be sequentially and partially etched to form a groove 227 through which the first impurity regions 201 may be exposed. The groove 227 may extend in the second direction, and a plurality of the grooves 227 may be formed along the first direction.

In some embodiments, an upper portion of the first impurity region 201 may be partially removed during the etching process for the formation of the groove 227. Accordingly, a height difference between the first and second impurity regions 201 and 203 may be generated, and thus a bridge or a short circuit between a conductive line structure 245 and a lower electrode contact 265 (see FIG. 20) formed by subsequent processes may be prevented.

Figure 17:
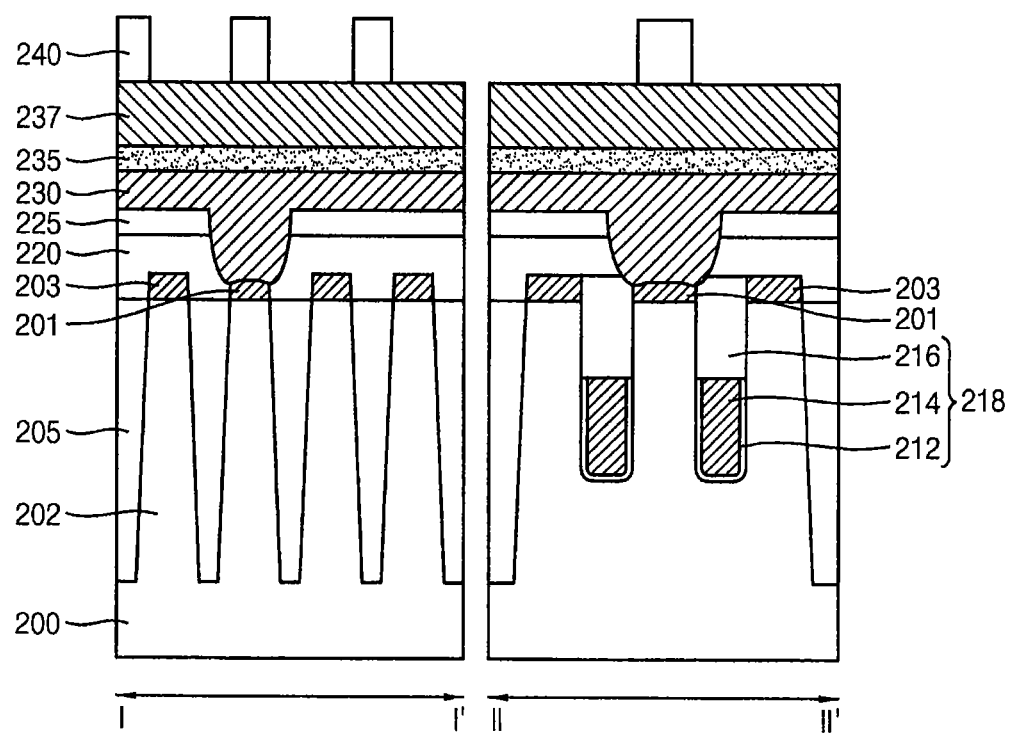

Referring to FIG. 17, a first conductive layer 230 filling the groove 227 may be formed on the first insulating interlayer 225. A barrier conductive layer 235 and a second conductive layer 237 may be sequentially formed on the first conductive layer 230, and a mask pattern 240 may be formed on the second conductive layer 237.

For example, the first conductive layer 230 may be formed using doped polysilicon, the barrier conductive layer 235 may be formed of a metal nitride or a metal silicide nitride, and the second conductive layer 237 may be formed using a metal. The first conductive layer 230, the barrier conductive layer 235 and the second conductive layer 237 may be formed by, e.g., a sputtering process, a PVD process, CVD process, or an ALD process.

The mask pattern 240 may include, e.g., silicon nitride, and may extend in the second direction. A width of the mask pattern 240 (e.g., a width in the first direction) may be smaller than that of the groove 227.

Figure 18:
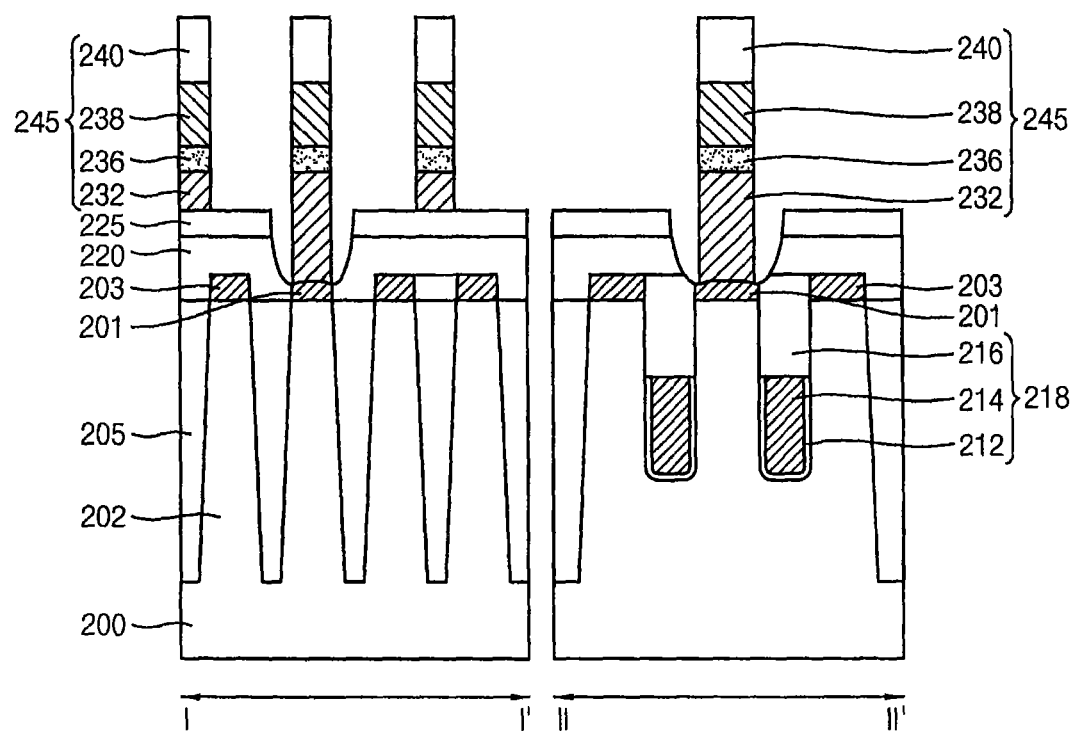

Referring to FIG. 18, the second conductive layer 237, the barrier conductive layer 235 and the first conductive layer 230 may be sequentially etched using the mask pattern 240 as an etching mask. Accordingly, a first conductive layer pattern 232, a barrier conductive layer pattern 236 and a second conductive layer pattern 238 may be sequentially formed on the first impurity region 201.

Thus, the conductive line structure 245 including the first conductive layer pattern 232, the barrier conductive layer pattern 236, the second conductive layer pattern 238 and the mask pattern 240 may be formed. The conductive line structure 245 may extend in the second direction on the first impurity regions 201. In example embodiments, the conductive line structure 245 may serve as a CSL.

In some embodiments, the conductive line structure 245 may have a narrower width that that of the groove 227. Thus, a sidewall of the conductive line structure 245 may be spaced apart from a sidewall of the groove 227.

Figure 19:
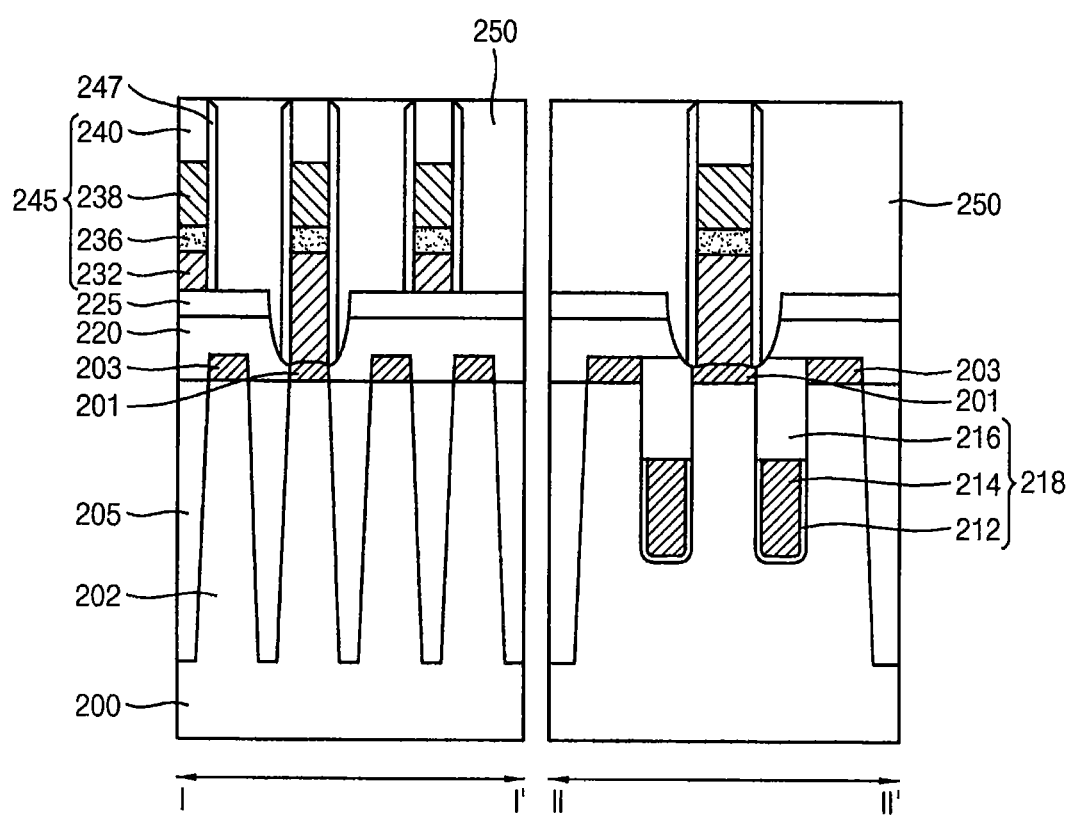

Referring to FIG. 19, a spacer 247 may be formed on the sidewall of the conductive line structure 245. For example, a spacer layer covering the conductive line structure 245 may be formed on the first insulating interlayer 225. The spacer layer may be anisotropically etched to form the spacer 247. The spacer layer may be formed of, e.g., silicon nitride.

A second insulating interlayer 250 covering the conductive line structure 245 may be formed on the first insulating interlayer 225. The second insulating interlayer 250 may fill a remaining portion of the groove 227.

In some embodiments, an upper portion of the second insulating interlayer 250 may be planarized by a CMP process such that a top surface of the mask pattern 240 may be exposed. The second insulating interlayer 250 may be formed of silicon oxide substantially the same as or similar to that of the first insulating interlayer 225.

Figure 20:
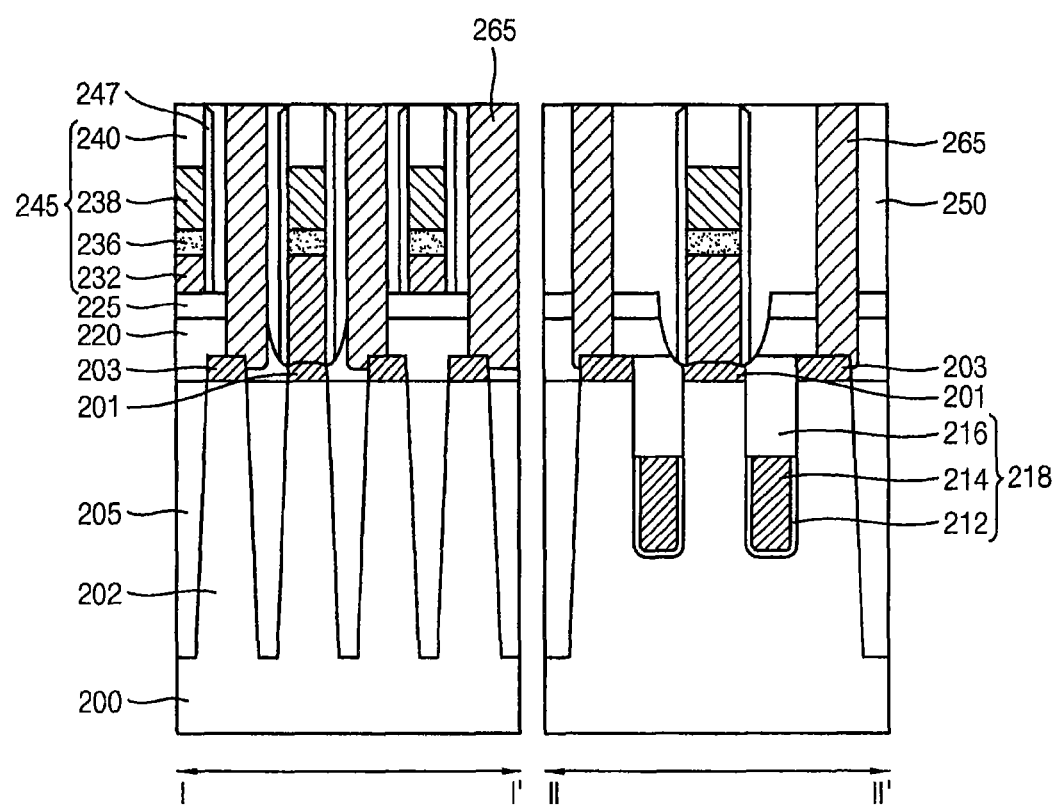

Referring to FIG. 20, the lower electrode contact 265 electrically connected to or being in contact with the second impurity region 203 may be formed through the second insulating interlayer 250, the first insulating interlayer 225 and the capping layer 220.

In example embodiments, the second insulating interlayer 250, the first insulating interlayer 225 and the capping layer 220 may be partially etched to form a contact hole through which the second impurity region 203 may be exposed. The contact hole may be formed per each of contact regions 257 indicated in FIG. 12.

A conductive layer sufficiently filling the contact holes may be formed, and an upper portion of the conductive layer may be planarized by a CMP process until a top surface of the second insulating interlayer 250 is exposed. Accordingly, the lower electrode contact 265 may be formed in each contact hole. A plurality of the lower electrode contacts 265 may be formed along the first and second directions to form a lower electrode contact array.

The conductive layer may be formed of a metal, a metal nitride and/or a metal silicide by a sputtering process or an ALD process. In some embodiments, a barrier conductive layer including, e.g., a metal nitride may be formed on an innerwall of the contact hole before forming the conductive layer.

In some embodiments, the lower electrode contact 265 may be formed by a selective epitaxial growth (SEG) process using the second impurity region 203 as a seed. In this case, the lower electrode contact 265 may include doped polysilicon or doped single crystalline silicon.

Figure 21:
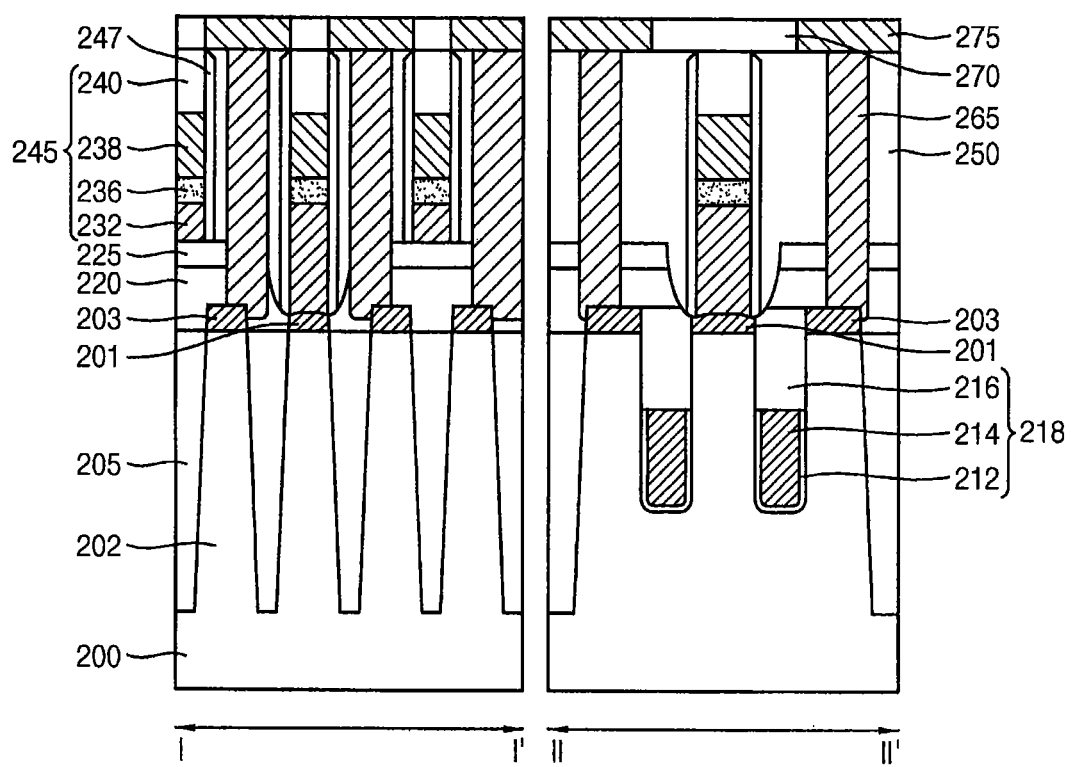

Referring to FIG. 21, a lower electrode 275 may be formed on the lower electrode contact 265.

In example embodiments, a third insulating interlayer 270 may be formed on the second insulating interlayer 250, the conductive line structure 245 and the lower electrode contact 265. The third insulating interlayer 270 may be partially etched to form an opening through which a top surface of the lower electrode contact 265 may be exposed. A lower electrode layer filling the opening may be formed on the lower electrode contact 265. An upper portion of the lower electrode layer may be planarized until a top surface of the third insulating interlayer 270 is exposed to form the lower electrode 275.

A plurality of the lower electrode 275 may be formed along the first and second directions to form a lower electrode array having an arrangement substantially the same as or similar to that of the lower electrode contact array.

Figure 22:
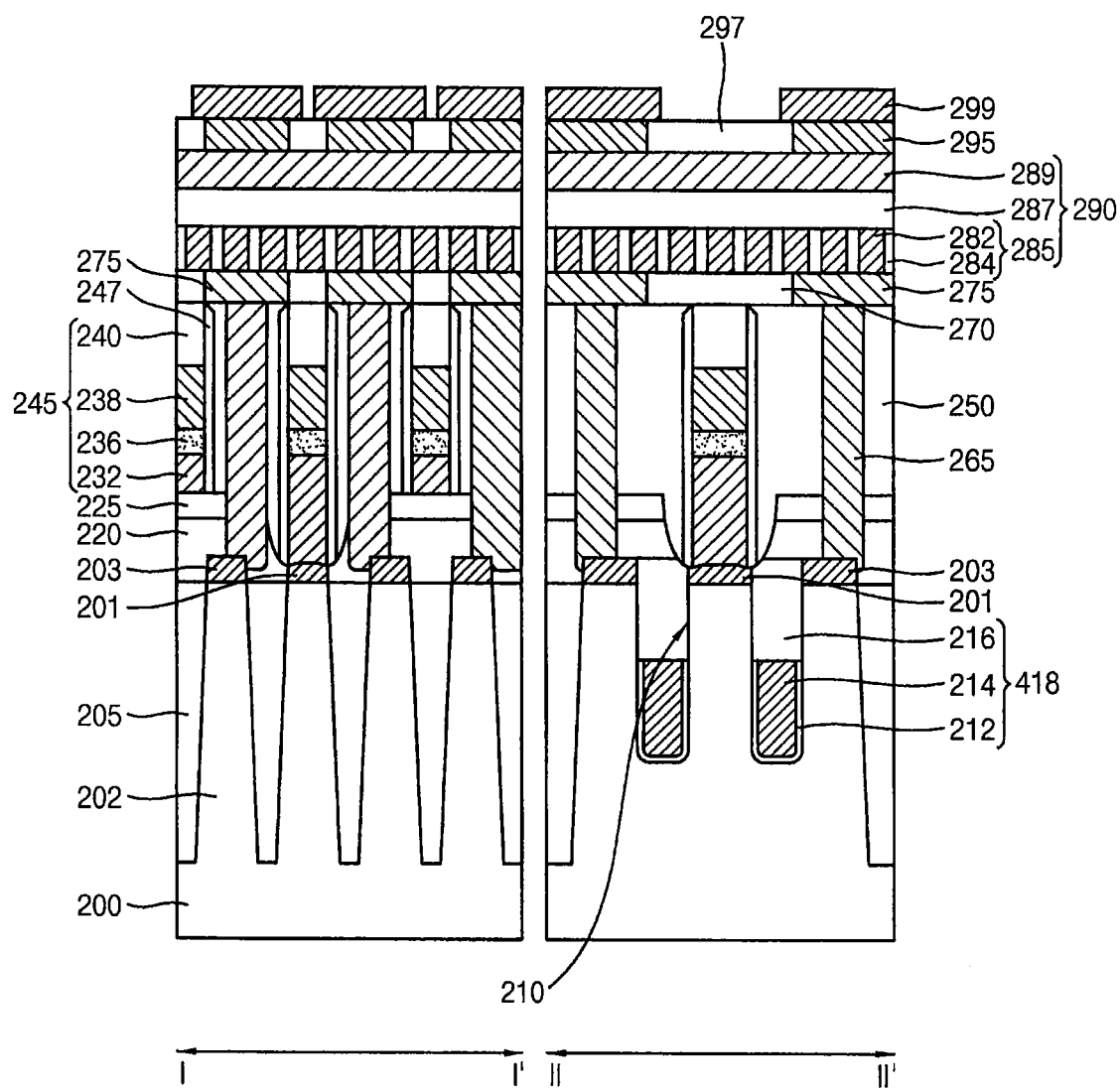

Referring to FIG. 22, processes substantially the same as or similar to those illustrated with reference to FIGS. 7 to 11 may be performed. Accordingly, an MTJ structure 290 provided commonly on the plurality of the lower electrodes 275 may be formed.

The MTJ structure 290 may include a first magnetic layer 285, a tunnel barrier layer 287 and as second magnetic layer 289. The first magnetic layer 285 may include first magnetic material patterns 282, and first insulation material patterns 284 segmenting or separating the first magnetic material patterns 282.

In some embodiments, the second magnetic layer 289 may be formed to include magnetic material patterns and insulating interlayer material patterns. In some embodiments, both the first magnetic layer 285 and the second magnetic layer 289 may include the magnetic material patterns and the insulation material patterns.

An upper electrode 295 may be formed on the MTJ structure 290. The upper electrode 295 may be substantially superimposed over the lower electrode 275, and a plurality of the upper electrodes 295 may form an upper electrode array having an arrangement substantially the same as or similar to that of the lower electrode array.

A fourth insulating interlayer 297 may be formed on the MTJ structure 290 to fill spaces between the upper electrodes 295.

A bit line 299 electrically connected to a plurality of the upper electrodes 295 may be formed on the fourth insulating interlayer 297. For example, the bit line 299 may extend in the second direction.

Figure 23:
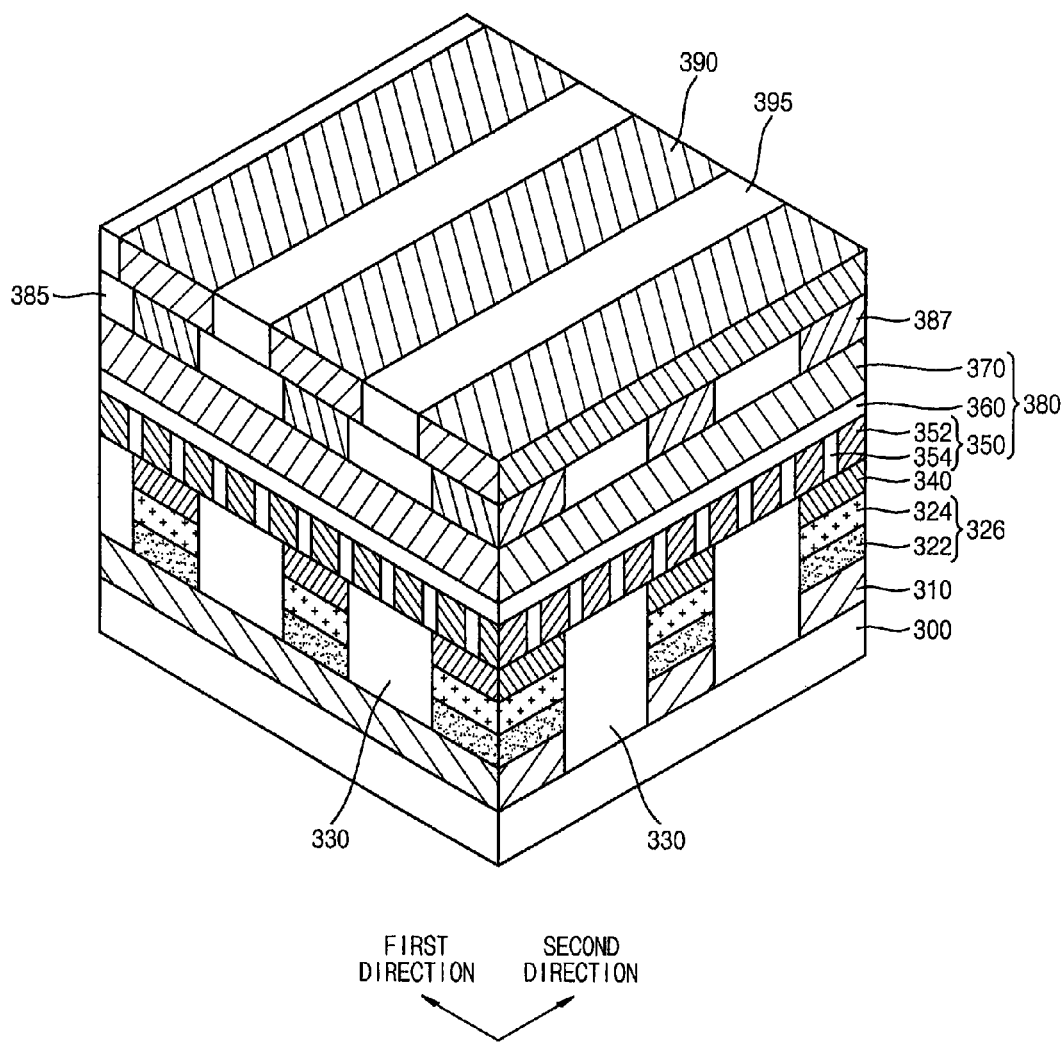

FIG. 23 is a perspective view illustrating a magnetic memory device in accordance with example embodiments. For example, FIG. 23 illustrates a magnetic memory device having a cross-point structure in which a memory cell may be defined at each intersection area of conductive lines.

Detailed descriptions on elements and/or constructions substantially the same as or similar to those illustrated with reference to FIGS. 1 to 3, or FIGS. 12 and 13 are omitted herein.

Referring to FIG. 23, the magnetic memory device may include a first conductive line 310 and a second conductive line 390 crossing each other, and may include a lower electrode 340, an MTJ structure 380 and an upper electrode 387 between the first conductive line 310 and the second conductive line 390.

The first conductive line 310 may be disposed on a base insulation layer 300, and may extend in a first direction substantially parallel to a top surface of the base insulation layer 300. A plurality of the first conductive lines 310 may be arranged along a second direction that may be parallel to the top surface of the base insulation layer 300 and may be perpendicular to the first direction.

The base insulation layer 300 may include an insulative material such as silicon oxide, silicon nitride or silicon oxynitride. The base insulation layer 300 may cover a lower structure (not illustrated) such as a transistor formed on, e.g., a semiconductor substrate (not illustrated).

The first conductive line 310 may include a metal such as tungsten, copper, aluminum, titanium or tantalum, or a metal nitride. In example embodiments, the first conductive line 210 may serve as a word line of the magnetic memory device.

The second conductive line 390 may be disposed over the first conductive line 310, and may extend in the second direction. A plurality of the second conductive lines 390 may be arranged along the first direction.

The second conductive line 390 may include a metal or a metal nitride substantially the same as or similar to that of the first conductive line 310. In example embodiments, the second conductive line 390 may serve as a bit line of the magnetic memory device.

A memory cell may be disposed at an intersection area of the first conductive line 310 and the second conductive line 390. In example embodiments, a plurality of the memory cells may be arranged along the first and second directions to form a cross-point array.

The memory cell may be defined by the lower electrode 340, the upper electrode 387, and a portion of the MTJ structure 380 between the lower electrode 340 and the upper electrode 387.

In example embodiments, a selection device may be disposed between the lower electrode 340 and the first conductive line 310. For example, the selection device may include a semiconductor diode 326. The semiconductor diode 326 may include a first semiconductor pattern 322 and a second semiconductor pattern 324 that may include different types of impurities.

A pillar structure may be defined by the semiconductor diode 326 and the lower electrode 340, and the pillar structure may be disposed at each intersection area.

A first insulating interlayer 330 may be formed between the neighboring first conductive lines 310 and between the neighboring pillar structures. Accordingly, the first conductive lines 310 may be insulated from each other in the second direction, and the pillar structures may be insulated from each other in the first and second directions. FIG. 23 illustrated that the first insulating interlayer 330 may have a single-leveled structure, however, the first insulating interlayer 330 may include a multi-layered or a multi-leveled structure.

The MTJ structure 380 may be disposed on the first insulating interlayer 330 and a plurality of the lower electrodes 340. The MTJ structure 380 may have elements and/or constructions substantially the same as or similar to those of the MTJ structure 180 illustrated in FIG. 1.

Accordingly, the MTJ structure 380 may have a plate shape extending in the first and second directions, and may include a first magnetic layer 350, a tunnel barrier layer 360 and a second magnetic layer 370 sequentially stacked on the lower electrodes 340 and the first insulating interlayer 330. The first magnetic layer 350 may include first magnetic material patterns 352 and first insulation material patterns 354 segmenting or separating the first magnetic material patterns 352.

In some embodiments, the MTJ structure 380 may have elements and/or constructions substantially the same as or similar to those of the MTJ structure 182 and 184 illustrated in FIG. 2 or FIG. 3. In this case, the second magnetic layer 370 may include magnetic material patterns and insulation material patterns.

A plurality of the upper electrodes 387 may be arranged on the MTJ structure 380 along the first and second directions. As described above, the upper electrode 387 may be disposed at the each intersection area of the first and second conductive lines 310 and 390, and may be superimposed over the lower electrode 340. A second insulating interlayer 385 may be formed on the MTJ structure 380 so that the upper electrodes 387 may be insulated from each other.

The second conductive line 390 may extend in the second direction as described above, and may be electrically connected to a plurality of the upper electrodes 387. The second conductive lines 390 may be insulated from each other in the first direction by a third insulating interlayer 395.

According to example embodiments, in the magnetic memory device having the cross-point structure, the selection device, the lower electrode 340 and the upper electrode 387 may be patterned to be provided per each intersection area. However, the MTJ structure 380 may be provided commonly on a plurality of the intersection areas without an additional etching process. Thus, an etching damage of the MTJ structure 380, and an operation failure and a reliability deterioration resulting therefrom may be avoided.

Figure 24:
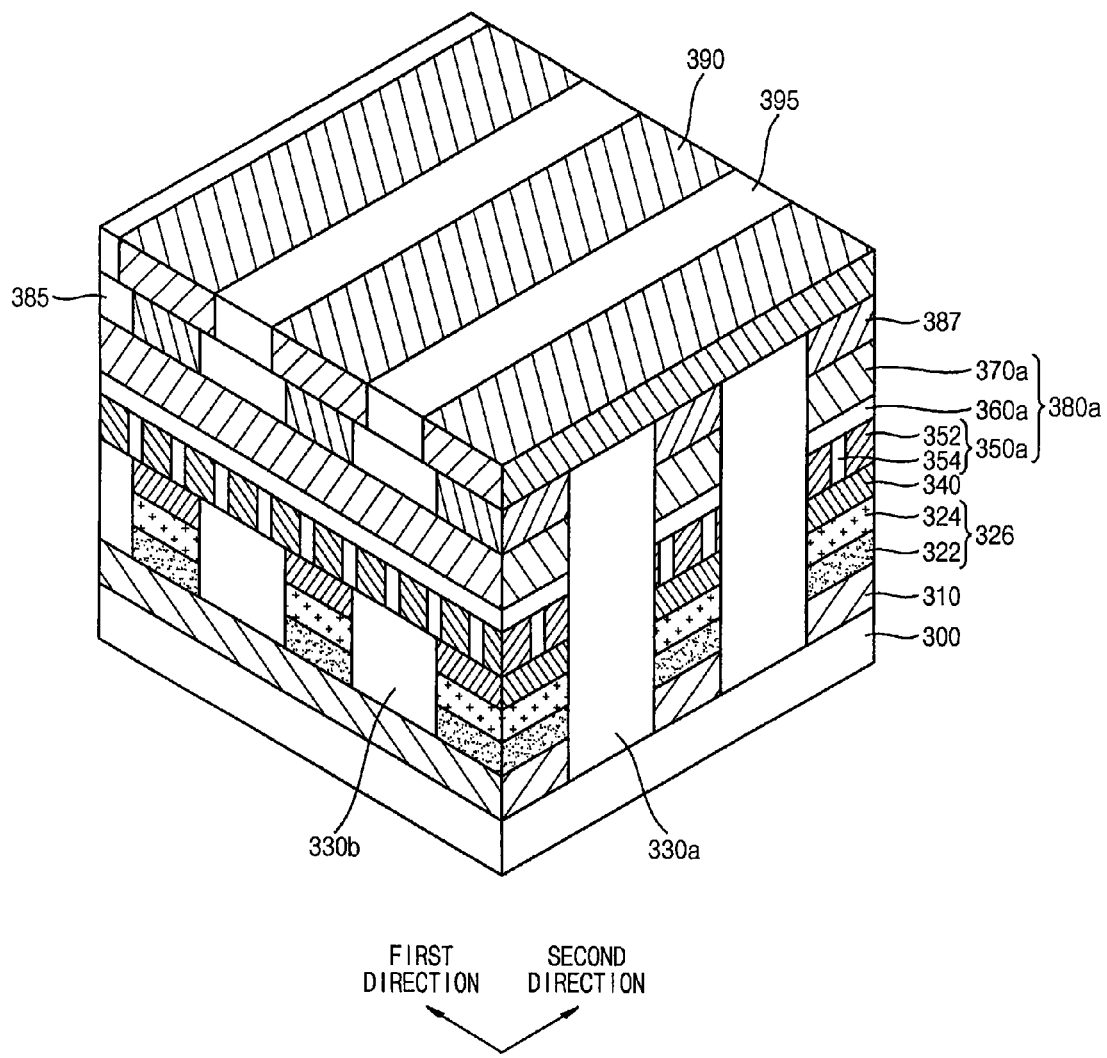
Figure 25:
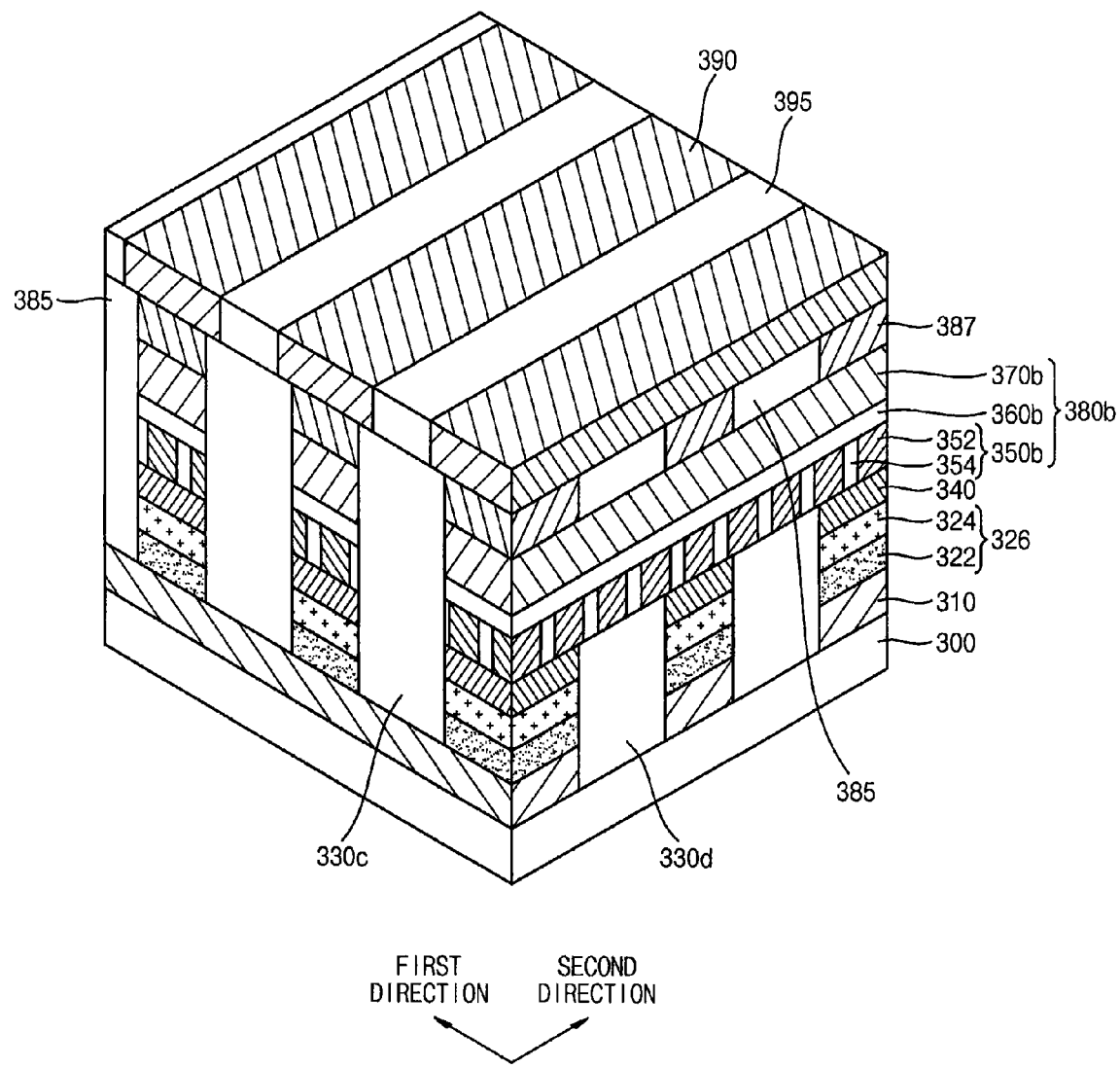

FIGS. 24 and 25 are perspective views illustrating magnetic memory devices in accordance with some example embodiments.

Referring to FIG. 24, an MTJ structure 380a may have a linear pattern shape or a fence shape extending in the first direction. In this case, the MTJ structure 380a may include a first magnetic layer 350a, a tunnel barrier layer 360a and a second magnetic layer 370a, each of which may extend linearly in the first direction.

A first insulating interlayer may include a first portion 330a extending in the first direction and insulating neighboring pillar structures and the MTJ structures 380a, and a second portion 330b extending in the second direction and insulating the neighboring pillar structures.

Referring to FIG. 25, an MTJ structure 380b may have a linear pattern shape or a fence shape extending in the second direction. In this case, the MTJ structure 380b may include a first magnetic layer 350b, a tunnel barrier layer 360b and a second magnetic layer 370b, each of which may extend in the second direction.

A first insulating interlayer may include a first portion 330c extending in the second direction and insulating neighboring pillar structures and the MTJ structures 380b, and a second portion 330d extending in the first direction and insulating the neighboring pillar structures.

As illustrated in FIGS. 24 and 25, the MTJ structure may be patterned along a direction of either a word line or a bit line according to a circuit construction. Thus, the number of etching processes or an etching amount for forming the MTJ structure may be reduced.

Figure 26:
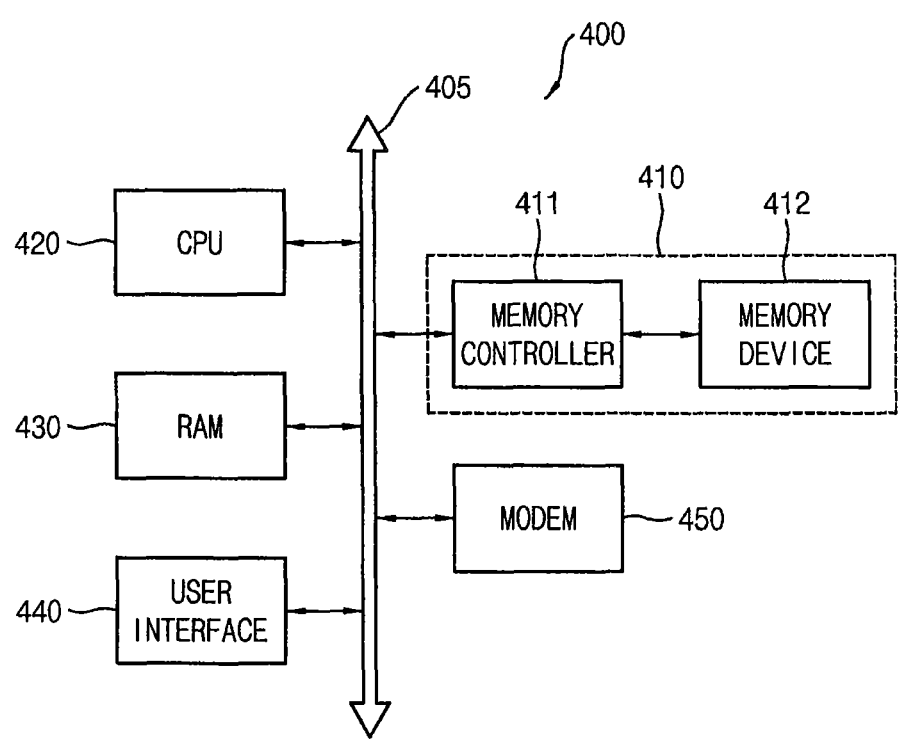

FIG. 26 is a block diagram of an information processing system in accordance with example embodiments.

Referring to FIG. 26, an information processing system 400 may include a CPU 420, a RAM 430, a user interface 440, a modem 450 such as a baseband chipset and a memory system 410 electrically connected to a system bus 405. The memory system 410 may include a memory device 412 and a memory controller 411. The memory system 412 may include the magnetic memory device in accordance with example embodiments. Thus, a large data processed in the CPU 420 or input from an external device may be stored in the memory system 412 with high stability and reliability. The memory controller 411 may have a construction capable of controlling the memory device 412. The memory system 410 may be provided as, e.g., a memory card or a solid state disk (SSD) by a combination of the memory device 412 and the memory controller 411.

When the information processing system 400 is implemented to a mobile device, a battery may be further provided for supplying a driving voltage of the information processing system 400. The information processing system 400 may further include an application chipset, a camera image processor (CIS), a mobile DRAM, etc. The information processing system 400 may be also implemented to a mobile phone, an MP3 player, various electronic devices, etc.

According to example embodiments of the present inventive concept, a boundary pattern including an insulative material may be formed in a magnetic layer, e.g., a free layer included in an MTJ structure. A magnetic material included in the magnetic layer may be segmented by the boundary pattern. Thus, an etching process with respect to the magnetic layer for individually forming an MTJ structure at each memory cell may be omitted. Therefore, a deterioration of the MTJ structure due to an etching damage, or a short-circuit between the neighboring MTJ structures may be avoided. The magnetic memory device in accordance with example embodiments may be effectively employed to, e.g., a non-volatile memory device having a critical dimension of a memory cell less than about 30 nm or about 20 nm.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A magnetic memory device, comprising:
a substrate;
a plurality of first electrodes on a first plane on the substrate;
a plurality of second electrodes on a second plane that is different from the first plane; and
a magnetic tunnel junction (MTJ) structure between the plurality of first electrodes and the plurality of second electrodes, the MTJ structure including a first magnetic layer, a tunnel barrier layer and a second magnetic layer that are sequentially stacked on the plurality of first electrodes, and at least one of the first magnetic layer or the second magnetic layer including:
a plurality of magnetic material patterns; and
a plurality of insulation material patterns separating the plurality of magnetic material patterns from each other, wherein ones of the plurality of magnetic material patterns overlap with one of the plurality of first electrodes in plan view,
wherein the one of the plurality of first electrodes comprises a first one of the plurality of first electrodes, and the ones of the plurality of magnetic material patterns comprise first ones of the plurality of magnetic material patterns that overlap with the first one of the plurality of first electrodes in plan view,
wherein the plurality of first electrodes comprise a second one of the plurality of first electrodes, and the plurality of magnetic material patterns comprise second ones of the plurality of magnetic material patterns that overlap with the second one of the plurality of first electrodes in plan view, and
wherein the plurality of magnetic material patterns comprise third ones of the plurality of magnetic material patterns that are between the first ones of the plurality of magnetic material patterns and the second ones of the plurality of magnetic material patterns.

2. The magnetic memory device of claim 1, wherein the MTJ structure has a plate shape extending in a first direction and a second direction parallel to a top surface of the substrate and perpendicular to each other.

3. The magnetic memory device of claim 1, wherein the magnetic material patterns include iron (Fe), cobalt (Co), nickel (Ni), chrome (Cr) and/or platinum (Pt), and
the insulation material patterns include silicon oxide, silicon nitride and/or silicon oxynitride.

4. The magnetic memory device of claim 3, wherein the insulation material patterns enclose the respective magnetic material patterns.

5. The magnetic memory device of claim 1, wherein the insulation material patterns include a ring pattern or a net pattern.

6. The magnetic memory device of claim 5, wherein the magnetic material patterns are in holes included in the ring pattern or the net pattern.

7. The magnetic memory device of claim 1, wherein the magnetic material patterns and the insulation material patterns are distributed throughout an entire area of the first magnetic layer or the second magnetic layer.

8. The magnetic memory device of claim 1, wherein each of the plurality of first electrodes and each of the plurality of second electrodes overlap to form a pair of electrodes,
a portion of the magnetic material patterns between the pair of electrodes comprises a cell pattern, and
a portion of the magnetic material patterns not between the pair of electrodes comprises a dummy magnetic pattern.

9. The magnetic memory device of claim 1, wherein the ones of the plurality of magnetic material patterns that overlap with the one of the plurality of first electrodes in plan view contact the one of the plurality of first electrodes.

10. The magnetic memory device of claim 1, wherein the first ones of the plurality of magnetic material patterns are electrically connected to the first one of the plurality of first electrodes, and the second ones of the plurality of magnetic material patterns are electrically connected to the second one of the plurality of first electrodes, and
wherein the third ones of the plurality of magnetic material patterns are electrically isolated from the plurality of first electrodes.

11. The magnetic memory device of claim 1, wherein some of the ones of the plurality of magnetic material patterns only partially overlap with the one of the plurality of first electrodes.

12. The magnetic memory device of claim 1, wherein the second magnetic layer has a unitary structure and is electrically connected to ones of the plurality of second electrodes.

13. The magnetic memory device of claim 3, wherein each of the plurality of insulation material patterns has a line width in a range of about 1 nm to about 3 nm, and wherein each of the plurality of magnetic material patterns has a width in a range of about 4 nm to about 6 nm.

14. A magnetic memory device, comprising:
a plurality of first conductive lines extending in a first direction;
a plurality of second conductive lines extending over the first conductive lines and in a second direction crossing the first direction;
a magnetic tunnel junction (MTJ) structure between the plurality of first conductive lines and the plurality of second conductive lines, the MTJ structure including a first magnetic layer that comprises:
a plurality of magnetic material patterns; and
a plurality of insulation material patterns separating the plurality of magnetic material patterns from each other;
a plurality of lower electrodes at intersection areas of the plurality of first conductive lines and the plurality of second conductive lines and between the plurality of first conductive lines and the MTJ structure, wherein ones of the plurality of magnetic material patterns overlap with one of the plurality of lower electrodes in plan view, and some of the ones of the plurality of magnetic material patterns only partially overlap with the one of the plurality of lower electrodes in plan view; and
a plurality of upper electrodes at the intersection areas and between the plurality of second conductive lines and the MTJ structure.

15. The magnetic memory device of claim 14, wherein the MTJ structure includes a second magnetic layer and a tunnel barrier layer between the first and second magnetic layers, and
wherein the plurality of magnetic material patterns contact the tunnel barrier layer.

16. The magnetic memory device of claim 14, wherein the MTJ structure has a linear shape extending in the first direction or the second direction, and
wherein the MTJ structure is one among a plurality of the MTJ structures that are arranged along the second direction or the first direction.

17. The magnetic memory device of claim 14, wherein the first conductive lines serve as word lines, and the second conductive lines serve as bit lines.

18. The magnetic memory device of claim 14, further comprising selection devices between the first conductive lines and the lower electrodes.

* * * * *